United States Patent
Yamazaki

(10) Patent No.: US 12,173,202 B2
(45) Date of Patent: *Dec. 24, 2024

(54) CURABLE SILICONE COMPOSITION, CURED PRODUCT THEREOF, AND METHOD FOR PRODUCING SAME

(71) Applicant: DOW TORAY CO., LTD., Tokyo (JP)

(72) Inventor: Ryosuke Yamazaki, Ichihara (JP)

(73) Assignee: DOW TORAY CO., LTD., Tokyo (JP)

(*) Notice: Subject to any disclaimer, the term of this patent is extended or adjusted under 35 U.S.C. 154(b) by 817 days.

This patent is subject to a terminal disclaimer.

(21) Appl. No.: 17/418,382

(22) PCT Filed: Dec. 27, 2019

(86) PCT No.: PCT/JP2019/051393
§ 371 (c)(1),
(2) Date: Sep. 28, 2021

(87) PCT Pub. No.: WO2020/138410
PCT Pub. Date: Jul. 2, 2020

(65) Prior Publication Data
US 2022/0064491 A1 Mar. 3, 2022

(30) Foreign Application Priority Data
Dec. 27, 2018 (JP) ................. 2018-245660

(51) Int. Cl.
| | |
|---|---|
| C09J 7/35 | (2018.01) |
| C09J 5/06 | (2006.01) |
| C09J 7/10 | (2018.01) |
| C09J 7/40 | (2018.01) |
| C09J 11/04 | (2006.01) |
| C09J 11/06 | (2006.01) |
| H01L 21/56 | (2006.01) |
| H01L 23/29 | (2006.01) |

(52) U.S. Cl.
CPC ............ C09J 7/35 (2018.01); C09J 5/06 (2013.01); C09J 7/10 (2018.01); C09J 7/405 (2018.01); C09J 11/04 (2013.01); C09J 11/06 (2013.01); H01L 21/565 (2013.01); H01L 23/296 (2013.01); C09J 2203/326 (2013.01); C09J 2301/304 (2020.08); C09J 2483/00 (2013.01)

(58) Field of Classification Search
CPC ......... C09J 7/35; C09J 5/06; C09J 7/10; C09J 7/405; C09J 11/04; C09J 11/06; C09J 2203/326; C09J 2301/304; C09J 2483/00; C09J 2301/408; C09J 7/40; H01L 21/565; H01L 23/296; H01L 23/295; H01L 23/562; H01L 33/56; H01L 21/56; B32B 27/00; C08K 3/01; C08K 5/14; C08K 5/098; C08L 83/04; C08L 2205/025; C08L 2205/03; C08G 77/04; C08G 77/12; C08G 77/20

See application file for complete search history.

(56) References Cited

U.S. PATENT DOCUMENTS

| | | |
|---|---|---|
| 5,100,976 A | 3/1992 | Hamada et al. |
| 5,145,886 A | 9/1992 | Oxman et al. |
| 5,169,727 A | 12/1992 | Boardman |
| 5,357,007 A | 10/1994 | Wengrovius et al. |
| 5,392,592 A | 2/1995 | Bozich et al. |
| 5,977,243 A | 11/1999 | Barthel et al. |
| 6,177,506 B1 | 1/2001 | Takahashi et al. |
| 6,376,569 B1 | 4/2002 | Oxman et al. |
| 6,379,792 B1 | 4/2002 | Isshiki et al. |
| 6,433,055 B1 | 8/2002 | Kleyer et al. |
| 8,124,689 B2 | 2/2012 | Loubert et al. |
| 2002/0132891 A1 | 9/2002 | Azechi et al. |
| 2004/0265599 A1 | 12/2004 | Ushio et al. |
| 2006/0057779 A1 | 3/2006 | Sutoh et al. |
| 2006/0094834 A1 | 5/2006 | Aoki et al. |

(Continued)

FOREIGN PATENT DOCUMENTS

| | | |
|---|---|---|
| AU | 618818 B2 | 1/1992 |
| CN | 101151328 A | 3/2008 |

(Continued)

OTHER PUBLICATIONS

Machine assisted English translation of JPH11158379A obtained from https://worldwide.espacenet.com/patent on Nov. 9, 2023, 11 pages.
Machine assisted English translation of CN106715593A obtained from https://patents.google.com/patent on Mar. 14, 2023, 26 pages.
Machine assisted English translation of JP2005007331A obtained from https://patents.google.com/patent on Mar. 14, 2023, 15 pages.
Machine assisted English translation of JP2004315571A obtained from https://patents.google.com/patent on Mar. 14, 2023, 15 pages.
Machine assisted English translation of JP2015010132A obtained from https://patents.google.com/patent on Mar. 14, 2023, 22 pages.
Machine assisted English translation of JP2004307691A obtained from https://patents.google.com/patent on Mar. 14, 2023, 11 pages.
Machine assisted English translation of JP2013222761A obtained from https://patents.google.com/patent on Mar. 15, 2023, 20 pages.

(Continued)

*Primary Examiner* — Michael B Nelson
(74) *Attorney, Agent, or Firm* — Warner Norcross + Judd LLP

(57) ABSTRACT

Provided is a curable silicone composition and applications thereof. The composition has hot-melt properties as a whole, superior workability and curing characteristics such as overmolding, as well as superior flexibility and stress relief properties of a cured product thereof, even when a relatively large amount of filler is blended. Also provided is a cured product with a relatively small coefficient of thermal expansion. A curable silicone composition, comprising: an organopolysiloxane resin where 20 mol % or more of the total siloxane units of the organopolysiloxane resin is siloxane units represented by $SiO_{4/2}$; and one or more functional fillers. A vinyl ($CH_2=CH-$) group content of curing reactive functional groups containing carbon-carbon double bonds is 0.05 to 1.50 mol % per 100 g of silicone component(s) in the composition.

10 Claims, No Drawings

(56) References Cited

U.S. PATENT DOCUMENTS

| | | |
|---|---|---|
| 2006/0270788 A1 | 11/2006 | Ozai et al. |
| 2008/0319144 A1 | 12/2008 | Morita et al. |
| 2009/0042043 A1 | 2/2009 | Joseph et al. |
| 2009/0075009 A1 | 3/2009 | Fujisawa et al. |
| 2009/0171013 A1 | 7/2009 | Taguchi et al. |
| 2009/0281222 A1 | 11/2009 | Nishiumi et al. |
| 2011/0104506 A1 | 5/2011 | Behl et al. |
| 2011/0236666 A1 | 9/2011 | Hall et al. |
| 2012/0139131 A1 | 6/2012 | Sugo et al. |
| 2013/0183776 A1 | 7/2013 | Kashiwagi et al. |
| 2013/0200554 A1 | 8/2013 | Mueller |
| 2013/0274398 A1 | 10/2013 | Shiobara et al. |
| 2014/0296468 A1 | 10/2014 | Kownacka et al. |
| 2014/0377570 A1 | 12/2014 | Hirai et al. |
| 2015/0115311 A1 | 4/2015 | Yoshida et al. |
| 2015/0124338 A1 | 5/2015 | Mayumi et al. |
| 2015/0183960 A1 | 7/2015 | Yamazaki et al. |
| 2015/0315427 A1 | 11/2015 | Yoshida et al. |
| 2015/0376482 A1 | 12/2015 | Bekemeier et al. |
| 2016/0230005 A1 | 8/2016 | Mayumi et al. |
| 2016/0311980 A1 | 10/2016 | Knoer |
| 2017/0057980 A1 | 3/2017 | Boyer et al. |
| 2017/0058103 A1 | 3/2017 | Fujisawa et al. |
| 2017/0092822 A1 | 3/2017 | Amako et al. |
| 2017/0166701 A1* | 6/2017 | Jo .................. C08G 77/38 |
| 2017/0283613 A1 | 10/2017 | Mochizuki |
| 2017/0355804 A1 | 12/2017 | Fujisawa et al. |
| 2018/0105692 A1 | 4/2018 | Imaizumi et al. |
| 2018/0208816 A1 | 7/2018 | Yamazaki et al. |
| 2018/0305547 A1 | 10/2018 | Dogen et al. |
| 2019/0169398 A1 | 6/2019 | Yamazaki |
| 2019/0169435 A1 | 6/2019 | Yamazaki |
| 2019/0177488 A1 | 6/2019 | Yamazaki |
| 2019/0276684 A1 | 9/2019 | Yamazaki et al. |
| 2019/0367744 A1 | 12/2019 | Chevalier et al. |
| 2020/0216671 A1 | 7/2020 | Matsuzaki et al. |
| 2020/0224069 A1 | 7/2020 | Itoh et al. |
| 2020/0354615 A1 | 11/2020 | Itoh et al. |
| 2020/0392335 A1 | 12/2020 | Yamazaki |
| 2021/0162704 A1 | 6/2021 | Sreeram et al. |
| 2021/0179783 A1 | 6/2021 | Yoshitake |
| 2021/0179849 A1 | 6/2021 | Yoshitake |
| 2021/0189129 A1 | 6/2021 | Yamazaki et al. |
| 2021/0198489 A1 | 7/2021 | Yoshitake |
| 2021/0269691 A1 | 9/2021 | Itoh et al. |
| 2021/0284888 A1 | 9/2021 | Itoh et al. |
| 2021/0292607 A1 | 9/2021 | Itoh et al. |
| 2022/0002493 A1 | 1/2022 | Sugie et al. |
| 2022/0048230 A1 | 2/2022 | Imaizumi et al. |
| 2022/0064447 A1 | 3/2022 | Yamazaki |
| 2022/0064491 A1 | 3/2022 | Yamazaki |
| 2022/0089872 A1 | 3/2022 | Fukui et al. |
| 2022/0169894 A1 | 6/2022 | Yamazaki et al. |
| 2022/0186099 A1 | 6/2022 | Yamazaki et al. |
| 2022/0195269 A1 | 6/2022 | Yamazaki |
| 2022/0340756 A1 | 10/2022 | Nishijima et al. |
| 2022/0403114 A1 | 12/2022 | Sugie et al. |
| 2023/0044439 A1 | 2/2023 | Yamamoto et al. |
| 2023/0137947 A1 | 5/2023 | Yamazaki et al. |
| 2023/0151215 A1 | 5/2023 | Yamazaki et al. |
| 2024/0002605 A1 | 1/2024 | Tanaka et al. |
| 2024/0052106 A1 | 2/2024 | Yamazaki et al. |
| 2024/0052220 A1 | 2/2024 | Yamamoto et al. |

FOREIGN PATENT DOCUMENTS

| | | |
|---|---|---|
| CN | 103849149 A | 6/2014 |
| CN | 104870585 A | 8/2015 |
| CN | 106459419 A | 2/2017 |
| CN | 106715593 A | 5/2017 |
| CN | 107429062 A | 12/2017 |
| CN | 108026373 A | 5/2018 |
| CN | 109844029 A | 6/2019 |
| EP | 1002834 A1 | 5/2000 |
| EP | 3954739 A1 | 2/2022 |
| EP | 4083140 A1 | 11/2022 |
| EP | 4130157 A1 | 2/2023 |
| EP | 4269503 A1 | 11/2023 |
| JP | H0275681 A | 3/1990 |
| JP | H0625602 A | 2/1994 |
| JP | H11158379 A | 6/1999 |
| JP | H11279182 A | 10/1999 |
| JP | H11335572 A | 12/1999 |
| JP | 2000063681 A | 2/2000 |
| JP | 2000198929 A | 7/2000 |
| JP | 2001019933 A | 1/2001 |
| JP | 2002155261 A | 5/2002 |
| JP | 2003176462 A | 6/2003 |
| JP | 2003226812 A | 8/2003 |
| JP | 2004043814 A | 2/2004 |
| JP | 2004307691 A | 11/2004 |
| JP | 2004315571 A | 11/2004 |
| JP | 2005007331 A | 1/2005 |
| JP | 2006188593 A | 7/2006 |
| JP | 2006274007 A | 10/2006 |
| JP | 2007119768 A | 5/2007 |
| JP | 2007231039 A | 9/2007 |
| JP | 2009503133 A | 1/2009 |
| JP | 2009132797 A | 6/2009 |
| JP | 2009155415 A | 7/2009 |
| JP | 2010047646 A | 3/2010 |
| JP | 2010047676 A | 3/2010 |
| JP | 2010509088 A | 3/2010 |
| JP | 2011525444 A | 9/2011 |
| JP | 2012017427 A | 1/2012 |
| JP | 2013076050 A | 4/2013 |
| JP | 2013523482 A | 6/2013 |
| JP | 2013147546 A | 8/2013 |
| JP | 2013221075 A | 10/2013 |
| JP | 2013221082 A | 10/2013 |
| JP | 2013222761 A | 10/2013 |
| JP | 2013232580 A | 11/2013 |
| JP | 5385247 B2 | 1/2014 |
| JP | 2014009322 A | 1/2014 |
| JP | 2015010132 A | 1/2015 |
| JP | 2015110752 A | 6/2015 |
| JP | 2015214637 A | 12/2015 |
| JP | 2016124967 A | 7/2016 |
| JP | 2017512224 A | 5/2017 |
| JP | 2017101137 A | 6/2017 |
| JP | 2017520918 A | 7/2017 |
| JP | 2017226724 A | 12/2017 |
| JP | 2018519369 A | 7/2018 |
| JP | 2018177993 A | 11/2018 |
| JP | 2019167832 A | 10/2019 |
| JP | 2019167833 A | 10/2019 |
| JP | 2021107149 A | 7/2021 |
| JP | 2021108319 A | 7/2021 |
| TW | 201439219 A | 10/2014 |
| WO | 2006104236 A1 | 10/2006 |
| WO | 2008056810 A1 | 5/2008 |
| WO | 2013051600 A1 | 4/2013 |
| WO | 2014002918 A1 | 1/2014 |
| WO | 2014136805 A1 | 9/2014 |
| WO | 2015056483 A1 | 4/2015 |
| WO | 2015126780 A1 | 8/2015 |
| WO | 2015155949 A1 | 10/2015 |
| WO | 2016038836 A1 | 3/2016 |
| WO | 2016103654 A1 | 6/2016 |
| WO | 2016136243 A1 | 9/2016 |
| WO | 2017068762 A1 | 4/2017 |
| WO | 2018028792 A1 | 2/2018 |
| WO | 2018030286 A1 | 2/2018 |
| WO | 2018030287 A1 | 2/2018 |
| WO | 2018030288 A1 | 2/2018 |
| WO | 2018084012 A1 | 5/2018 |
| WO | 2018186161 A1 | 10/2018 |
| WO | 2018235491 A1 | 12/2018 |
| WO | 2018235492 A1 | 12/2018 |
| WO | 2019059351 A1 | 3/2019 |
| WO | 2019078140 A1 | 4/2019 |
| WO | 2019088067 A1 | 5/2019 |
| WO | 2019208756 A1 | 10/2019 |
| WO | 2020090797 A | 5/2020 |

(56) References Cited

FOREIGN PATENT DOCUMENTS

| WO | 2020138055 A1 | 7/2020 |
|---|---|---|
| WO | 2020138409 A1 | 7/2020 |
| WO | 2020138410 A1 | 7/2020 |
| WO | 2020166692 A1 | 8/2020 |
| WO | 2020203304 A1 | 10/2020 |
| WO | 2020203307 A1 | 10/2020 |
| WO | 2021132710 A1 | 7/2021 |
| WO | 2021200643 A1 | 10/2021 |
| WO | 2022004463 A1 | 1/2022 |
| WO | 2022138336 A1 | 6/2022 |

OTHER PUBLICATIONS

Machine assisted English translation of JP2018177993A obtained from https://patents.google.com/patent on Mar. 15, 2023, 36 pages.
International Search Report for PCT/JP2019/051394 dated Mar. 17, 2020, 2 pages.
International Search Report for PCT/JP2019/051392 dated Mar. 17, 2020, 2 pages.
International Search Report for PCT/JP2019/051391 dated Mar. 13, 2020, 3 pages.
International Search Report for PCT/JP2020/012028 dated Jun. 9, 2020, 3 pages.
Machine assisted English translation of JP2013221082A obtained from https://patents.google.com/patent on Oct. 27, 2021, 14 pages.
Machine assisted English translation of WO2020138410A1 obtained from https://patents.google.com/patent on Oct. 27, 2021, 19 pages.
Machine assisted English translation of JP11335572A obtained from https://patents.google.com/patent on Oct. 27, 2021, 7 pages.
Machine assisted English translation of JPH11279182A obtained from https://patents.google.com/patent on Oct. 27, 2021, 8 pages.
Machine assisted English translation of JP2003176462A obtained from https://patents.google.com/patent on Oct. 27, 2021, 11 pages.
Machine assisted English translation of JP2009132797A obtained from https://patents.google.com/patent on Oct. 27, 2021, 9 pages.
Machine assisted English translation of JP2012017427A obtained from https://patents.google.com/patent on Oct. 27, 2021, 13 pages.
Machine assisted English translation of JP2000063681A obtained from https://patents.google.com/patent on Oct. 28, 2021, 8 pages.
International Search Report for PCT/JP2020/012027 dated Jun. 9, 2020, 3 pages.
International Search Report for PCT/JP2020/012030 dated Jun. 9, 2020, 2 pages.
International Search Report for PCT/JP2020/012029 dated Jun. 9, 2020, 3 pages.
International Search Report (with English translation) for PCT/JP2020/049074 dated Mar. 23, 2021, 7 pages.
Machine assisted English translation of JPH0625602 obtained from https://patents.google.com/patent on Nov. 11, 2022, 6 pages.
Machine assisted English translation of JP2019167832 obtained from https://patents.google.com/patent on Nov. 11, 2022, 11 pages.
Machine assisted English translation of JP2019167833 obtained from https://patents.google.com/patent on Nov. 11, 2022, 9 pages.
International Search Report (with English translation) for PCT/JP2021/012840 dated Jun. 15, 2021, 6 pages.
English translation of International Search Report for PCT/JP2022/046146 dated Jan. 31, 2023, 2 pages.
Machine assisted English translation of JP2017101137A obtained from https://worldwide.espacenet.com/patent on Apr. 7, 2024, 18 pages.
Machine assisted English translation of JP2021108319A obtained from https://worldwide.espacenet.com/patent on Mar. 12, 2024, 73 pages.
Machine assisted English translation of WO2020138055A1 obtained from https://worldwide.espacenet.com/patent on Apr. 7, 2024, 43 pages.
English translation of International Search Report for PCT/JP2019/042320 dated Mar. 24, 2020, 2 pages.
Machine assisted English translation of JP2010047676A obtained from https://patents.google.com/patent on Jul. 21, 2021, 9 pages.
Machine assisted English translation of JP2015214637A obtained from https://patents.google.com/patent on Jul. 21, 2021, 11 pages.
Machine assisted English translation of JP2017101137A obtained from https://patents.google.com/patent on Jul. 21, 2021, 11 pages.
English translation of International Search Report for PCT/JP2021/046092 dated Feb. 8, 2022, 2 pages.
English translation of International Search Report for PCT/JP2021/046093 dated Mar. 15, 2022, 2 pages.
Dowsiltm EA-4600 Silicone Adhesive Application Guide for PCT Device Assemblies (Dow Toray Co., Ltd. publication, Form No. 1-3497-42-1120 S2D, 2020).
Machine assisted English translation of WO2019208756A1 obtained from https://worldwide.espacenet.com/patent on Dec. 21, 2023, 32 pages.
Machine assisted English translation of JP2017226724A obtained from https://patents.google.com/patent on Aug. 14, 2024, 14 pages.
Machine assisted English translation of JP2003226812A obtained from https://patents.google.com/patent on Aug. 14, 2024, 11 pages.
Machine assisted English translation of JP2010047646A obtained from https://patents.google.com/patent on Aug. 14, 2024, 9 pages.
International Search Report for PCT/JP2019/051393 dated Mar. 17, 2020, 3 pages.
Machine assisted English translation of WO2018235492A1 obtained from https://patents.google.com/patent on Oct. 4, 2021, 20 pages.
Machine assisted English translation of JP2016124967A obtained from https://patents.google.com/patent on Oct. 4, 2021, 18 pages.
Machine assisted English translation of WO2016038836A1 obtained from https://patents.google.com/patent on Oct. 4, 2021, 18 pages.
Machine assisted English translation of WO2013051600A1 obtained from https://patents.google.com/patent on Oct. 4, 2021, 25 pages.
Machine assisted English translation of JP2007231039A obtained from https://patents.google.com/patent on Oct. 5, 2021, 7 pages.
Machine assisted English translation of CN103849149A obtained from https://worldwide.espacenet.com/patent on Jan. 22, 2024, 11 pages.

* cited by examiner

CURABLE SILICONE COMPOSITION, CURED PRODUCT THEREOF, AND METHOD FOR PRODUCING SAME

CROSS-REFERENCE TO RELATED APPLICATIONS

This application is the National Stage of International Appl. No. PCT/JP2019/051393 filed on 27 Dec. 2019, which claims priority to and all advantages of Japanese Patent Application No. 2018-245660 filed on 27 Dec. 2018, the content of which is hereby incorporated by reference.

TECHNICAL FIELD

The present invention relates to a curable silicone composition, a molded product (pellet, sheet, and the like) thereof, and a cured product thereof, which can be obtained by a simple manufacturing method and which has excellent hot-melt/molding properties as well as toughness and stress relief properties of the cured product. The present invention is related to a cured product of the composition as well as applications thereof (including, in particular, a member for semiconductors and a semiconductor having the cured product, and the like), a method for manufacturing the composition, a method for molding the cured product, and the like.

BACKGROUND TECHNOLOGY

Curable silicone compositions are utilized in a wide range of industrial fields because they are cured to form cured products having excellent heat resistance, cold resistance, electrical insulation, weather resistance, water repellency, and transparency. In general, the cured product of such a curable silicone composition is also suitable as an encapsulant for optical materials and semiconductor devices because it is not readily discolored as compared with other organic materials, and there is less deterioration of physical properties.

The present applicant has proposed, in Patent Document 1 and Patent Document 2, a so-called hot melt curable granular silicone composition and a reactive silicone composition for molding. These silicone compositions are made up of so-called phenyl silicone resins, which have the advantages of superior hot-melt properties and superior hardness and strength of the cured product when compared to methyl silicone resins.

On the other hand, in recent years, optical semiconductor devices have become smaller with higher output, and when these hot-melt curable granular silicone compositions and the like are applied, especially under high temperatures of 200° C. or higher, coloring derived from phenyl silicone resin may occur, and in particular, in the field of reflective materials, light reflectance may decrease. Therefore, there is a strong need for a silicone composition that satisfies the requirements for higher heat resistance and color resistance while achieving hot-melt properties and mechanical strength of the cured product after molding.

Here, in Patent Document 3, a hot-melt curable silicone sheet using a methyl silicone resin is disclosed, but a granular composition is neither described nor suggested in the present invention. Furthermore, organic solvents are indispensable in the mixing process of the compositions in question, and there is no description or suggestion of compositions or granular compositions containing large amounts of functional fillers (especially white pigments) suitable for molding materials. Furthermore, the composition is difficult to use as a composition for molding because the organic solvent must be removed in the process of preparing the sheet, and only a thin sheet can be made to avoid residual solvent. In addition, the fast curing/immediate curing required in the molding process is difficult to achieve because heat is applied in the solvent removal process. Therefore, application of the compositions disclosed in Patent Document 3 to solve the problems described above was difficult.

Furthermore, Patent Document 4 discloses curable silicone pellets for molding using methyl silicone resin, but the production of this composition requires melt mixing at a high temperature, making controlling the curability of the composition difficult and molding over a short period at a low temperature difficult.

On the other hand, in Patent Documents 5 to 8, the Applicants propose that the use of inorganic fillers that do not contain coarse particles in a curable granular silicone composition can improve the toughness and durability, especially at high temperatures, the gap-filling property during melting, and optical reflectance. However, in recent years, with regards to requirements regarding applicability to various semiconductor applications, including power semiconductors, there is still room for improvement with these curable granular silicone compositions with regards to their properties. In particular, when the content of inorganic filler is increased in order to reduce the coefficient of thermal expansion represented by the average coefficient of linear expansion, it is generally difficult to achieve both of these properties because the resulting cured product has a relatively high hardness at room temperature, which results in a trade-off such as poor flexibility and a decrease in the stress relief properties thereof. Therefore, it is highly desirable to have a heat-melting curable silicone composition where the cured product has excellent flexibility and stress relief properties at room temperature, and which has a small coefficient of thermal expansion.

PRIOR ART DOCUMENTS

Patent Documents

Patent Document 1: International Unexamined Patent Application 2016/136243
Patent Document 2: Japanese Unexamined Patent Application 2014-009322
Patent Document 3: Japanese Unexamined Patent Application Publication (Translation of PCT Application) No. 2017-512224
Patent Document 4: Japanese Unexamined Patent Application 2009-155415
Patent Document 5: International Unexamined Patent Application 2018/030286
Patent Document 6: International Unexamined Patent Application 2018/030287
Patent Document 7: International Unexamined Patent Application 2018/030288

SUMMARY OF THE INVENTION

Problem to be Solved by the Invention

The object of the present invention is to provide a curable silicone composition having hot-melt properties, excellent workability and curing characteristics such as overmolding, and excellent stress relief properties, as well as providing a cured product having a relatively small coefficient of thermal expansion. Furthermore, the present invention provides such curable silicone compositions in the form of particles, pellets, sheets, and the like, and in the form of peelable laminates containing said curable silicone composition sheets. An object of the present invention is to provide a semiconductor device member made up of a curable silicone composition and a cured product, a semiconductor device having the cured product, and a molding method of the cured product.

Means for Solving the Problems

As a result of intensive investigation, the present inventors have developed a composition including organopolysiloxane resins with siloxane units, at least 20 mol % of which is a siloxane unit represented by $SiO_{4/2}$, and one or more functional fillers, where the content of the vinyl (CH2=CH—) group portion of the curing reactive functional group containing a carbon-carbon double bond per 100 g of silicone component in the composition is 0.05 to 1.50 mol %, the curable silicone composition having hot-melt properties as a whole, and in particular containing:

(A) 100 mass parts of an organopolysiloxane resin having no hot-melt properties as a whole molecule, having a curing reactive functional group containing a carbon-carbon double bond in the molecule, and contains a siloxane unit represented by $SiO_{4/2}$ making up at least 20 mol % or more of the total siloxane units; (B) 300 to 600 mass parts of an organopolysiloxane resin having no hot-melt properties as a whole molecule, having no curing reactive functional group containing a carbon-carbon double bond in the molecule, and contains a siloxane unit represented by $SiO_{4/2}$ making up at least 20 mol % or more of the total siloxane units;
(C) 65 to 300 mass parts of a straight or branched chain organopolysiloxane, liquid at 25° C., having a curing reactive functional group containing at least two carbon-carbon double bonds in the molecule;
(D) one or more curing agents selected from (d1) or (d2) below, in an amount necessary to cure the composition:
(d1) an organic peroxide, or
(d2) an organohydrogenpolysiloxane having at least two silicon-bonded hydrogen atoms
in the molecule and a hydrosilylation reaction catalyst; and
(E) a functional filler, wherein:
the amount of component (E) is in the range of 10 to 1,000 mass parts relative to 100 mass parts of the sum of the components (A) to (C) and characteristics of being hot-meltable as an entire composition, and the curable silicone composition described above was discovered to solve the problem as described above, arriving at the present invention. Note that the curable silicone composition as described above may be in the form of particles, pellets, or sheets.

Furthermore, the curable silicone composition described above can be used in a peelable laminate having the following configuration. In other words, it may be in the form of a curable silicone composition sheet with a thickness of 1 mm or less made up of the curable silicone composition, one or both sides of the curable silicone composition sheet having a peelable laminate having a sheet-like substrate with a release surface facing the curable silicone composition. Such curable silicone composition sheets may be used as film or sheet silicone adhesives.

Furthermore, the present inventors have found that the cured product of the curable silicone composition, in particular, the use of the cured product as a member for semiconductor devices, and semiconductor devices having the cured product (including one or more types selected from power semiconductor devices, optical semiconductor devices, and semiconductor devices mounted on flexible circuit boards) can solve the problem described above, thus arriving at the present invention.

Similarly, the inventors have found that the above problem can be solved by a manufacturing method characterized in that each of the components constituting the curable silicone composition described above are granulated by mixing them under temperature conditions not exceeding 50° C., and a molding method of a cured product using the above curable granular silicone composition.

Note that the molding method described above includes transfer molding, compression molding, or injection molding, and the curable silicone composition of the present invention is suitably used as a material for the molding thereof. Furthermore, the curable silicone composition of the present invention can be suitably used as a molding material in a so-called overmold method, which is a step of coating a semiconductor element or a semiconductor circuit board with the cured product by overmold molding.

Effect of the Invention

The curable silicone composition of the present invention having hot-melt properties, superior workability and curing characteristics such as overmolding, as well as superior flexibility and stress relief properties of the cured product, even when a relatively large amount of filler is blended, as well as providing a cured product with a relatively small coefficient of thermal expansion. In addition, such a curable silicone composition can be produced using only simple mixing processes and can be efficiently manufactured. Furthermore, the present invention enables such curable silicone compositions to be provided in the form of particles, pellets, sheets, and the like, as well as in the form of peelable laminates containing said curable silicone composition sheets. Furthermore, a member for a semiconductor device that makes up a cured product of the curable silicone composition described above, a semiconductor device having the cured product, and a method for molding the cured product can be provided.

DETAILED DESCRIPTION OF THE INVENTION

Curable Silicone Composition

The curable silicone composition of the present invention made up of an organopolysiloxane resin contains a siloxane unit represented by $SiO_{4/2}$ making up at least 20 mol % or more of the total siloxane units, and one or more functional fillers, where the content of the vinyl (CH2=CH—) group portion of the curing reactive functional group containing a carbon-carbon double bond per 100 g of silicone component in the composition is 0.05 to 1.50 mol %, the composition having hot-melt properties as a whole. In the present invention, unless otherwise stated, "having hot-melt properties" means having a softening point of 50 to 200° C., having a melt viscosity at 150° C. (suitably, a melt viscosity of less than 1,000 Pa-s), and having flowing properties.

In other words, the curable silicone composition of the present invention includes functional fillers such as reinforcing fillers and thermally conductive fillers, uses an organopolysiloxane resin having a high content of a specific branched siloxane unit ($SiO_{4/2}$), and the content of curable functional groups in the entire silicone component is relatively low. This configuration can provide a cured product with superior flexibility and stress relief properties and a small coefficient of thermal expansion, even when a large amount of functional filler is blended. The curable silicone composition of the present invention may be and is preferably molded into particles, pellet or sheet form, depending on the application thereof. Hereinafter, each component and optional component of the composition will be described. In the present invention, the term "average particle diameter" means the primary average particle diameter of the particles unless otherwise defined.

The curable silicone composition of the present invention includes an organopolysiloxane resin and contains a siloxane unit represented by $SiO_{4/2}$ making up at least 20 mol % or more of the total siloxane units. The organopolysiloxane resin may further contain siloxane units represented by $R_3SiO_{1/2}$, $R_2SiO_{2/2}$, $RSiO_{3/2}$ (R is a monovalent organic group), hydroxyl groups represented by $R^2O_{1/2}$ ($R^2$ is a hydrogen atom or an alkyl group having 1 to 10 carbon atoms), but suitably includes siloxane units represented by $SiO_{4/2}$ in a range of at least 40 mol %, 50 mol % or more, and in particular, 50 to 90 mol % of the total siloxane units. If the content of the siloxane unit represented by $SiO_{4/2}$ is less than the lower limit described above, the technical effect of the present invention may not be achieved even if a large amount of other branched siloxane units (for example, $RSiO_{3/2}$) are included.

The curable silicone composition of the present invention contains one or more functional fillers. A functional filler is a component that imparts mechanical or other properties to the cured product, and examples include inorganic fillers, organic fillers, and mixtures thereof. Examples of the inorganic fillers include a reinforcing filler, a white pigment, a thermally conductive filler, an electrically conductive filler, a phosphor, and mixtures of at least two of these, and examples of organic fillers include a silicone resin filler, a fluorine resin filler, and a polybutadiene resin filler. The shape of these fillers is not particularly limited, and may be spherical, spindle-shaped, flat, needle-shaped, amorphous, or the like. In particular, the curable silicone composition of the present invention has the advantages of high stress relief properties of the cured product and low thermal expansion, even when a large amount of functional filler is blended.

The curable silicone composition of the present invention has the following requirements: of the silicone component, specifically the sum of the components including the organopolysiloxane resin and the reactive or non-reactive chain-like organopolysiloxane, the content of vinyl ($CH_2=CH-$) function groups in the curing reactive functional group including carbon-carbon double bonds per 100 g of component excluding components that are not silicone components, such as functional fillers and the like, must be 0.05 to 1.50 mol %, is preferably 0.25 to 1.40 mol %, and even more preferably 0.30 to 1.25 mol %. Curing reactive functional groups include alkenyl groups having 2 to 20 carbon atoms and monovalent organic groups containing acrylic groups, such as 3-methacryloxypropyl groups and 3-acryloxypropyl groups, having a vinyl group portion in said functional group. By suppressing the content of these curing reactive functional groups, even if a large amount of functional filler is blended into said composition, the cured product has the advantage of high stress relief properties and low thermal expansion.

The curable silicone composition of the present invention has hot-melt properties as an entire composition, has a softening point of 50° C. or higher, has a melt viscosity at 150° C. (suitably, a melt viscosity of less than 1,000 Pa·s), and has flowing properties. The individual components of said composition need not have hot-melt properties, and in particular, when the curing reactive or non-reactive organopolysiloxane resin is in particulate form, it is particularly preferred that it does not have hot-melt properties at a temperature below 200° C. The majority of functional fillers are components that do not have hot-melt properties.

The curable silicone composition according to the present invention is not limited in composition as long as it contains at least the components described above and has hot-melt properties as an entire composition, but in particular contains the following components (A) to (E):

(A) 100 mass parts of an organopolysiloxane resin having no hot-melt properties as a whole molecule, having a curing reactive functional group containing a carbon-carbon double bond in the molecule, and contains a siloxane unit represented by $SiO_{4/2}$ making up at least 20 mol % or more of the total siloxane units;

(B) 300 to 600 mass parts of an organopolysiloxane resin having no hot-melt properties as a whole molecule, having no curing reactive functional group containing a carbon-carbon double bond in the molecule, and contains a siloxane unit represented by $SiO_{4/2}$ making up at least 20 mol % or more of the total siloxane units;

(C) 65 to 300 mass parts of a straight or branched chain organopolysiloxane, liquid at 25° C., having a curing reactive functional group containing at least two carbon-carbon double bonds in the molecule;

(D) one or more curing agents selected from (d1) or (d2) below, in an amount necessary to cure the composition:

(d1) an organic peroxide, or (d2) an organohydrogenpolysiloxane having at least two silicon-bonded hydrogen atoms in the molecule and a hydrosilylation reaction catalyst; and (E) a functional filler, wherein:

The amount of component (E) is preferably in the range of 10 to 1,000 mass parts relative to 100 mass parts of the sum of the components (A) to (C). Furthermore, the curable silicone composition of the present invention may optionally include (F) hot-melt particles or other additives or the like having a drip point of 50° C. or more and a melt viscosity of 10 Pas or less as measured by a rotational viscometer at 150° C. Each of the components and their content will be described below.

Component (A)

Component (A) is one of the base compounds of the composition, and is an organopolysiloxane resin that contains a siloxane unit represented by $SiO_{4/2}$ making up at least 20 mol % or more of the total siloxane units, has no hot-melt properties alone, and has a curing reactive functional group containing a carbon-carbon double bond in the molecule. By combining this component with the components (B) and (C) in a predetermined quantitative range, hot-melt properties of the composition as a whole can be achieved. Such component (A) may be in the form of microparticles alone or together with other components (for example, component (B), which is reactive organopolysiloxane resin microparticles, and a portion of component (D), which is a curing agent), in which case the component is in particular preferably silicone microparticles which are spherical in shape with an average primary particle diameter of 1 to 20 μm.

Component (A) must have a curing reactive group having a carbon-carbon double bond in the molecule. This type of curing reactive group being hydrosilylation reactive or an organic peroxide curing functional group that forms a cured product based on a crosslinking reaction with other components. Such a curing reactive group is an alkenyl group or an acrylic group, and examples thereof include alkenyl groups having from 2 to 10 carbon atoms such as vinyl groups, allyl groups, butenyl groups, pentenyl groups, hexenyl groups, and heptenyl groups; and acrylic group-containing monovalent organic groups such as 3-methacryloxypropyl groups and 3-acryloxypropyl groups. Vinyl groups or hexenyl groups are particularly preferable.

Component (A) is an organopolysiloxane resin that does not have hot-melt properties as a whole molecule and is solid in a solvent-free state. Here, the absence of hot-melt properties means that the resin, which is component (A), does not exhibit heating and melting behavior independently at 200° C. or lower, and specifically means that they do not have a softening point or melt viscosity at a temperature of 200° C. or lower. In component (A), such properties are not structurally restricted, but the functional group in the organopolysiloxane resin is preferably a monovalent hydrocarbon group having 1 to 10 carbon atoms, in particular a functional group selected from an alkyl group having 1 to 10 carbon atoms such as a methyl group, and substantially free of aryl groups such as a phenyl group. If a large amount of phenyl groups and the like are included, the component may become hot-meltable and the effect of reinforcing the cured product of $SiO_{4/2}$ groups may be reduced.

Suitably, the functional group bonded to the silicone atom in component (A) is a group selected from a methyl group and an alkenyl group such as a vinyl group, and it is preferable that 70 to 99 mol % of all functional groups bonded to silicone atoms is a methyl group, and it is more preferable that 80 to 99 mol % of all functional groups bonded to silicone atoms is a methyl group, and it is particularly preferable that 88 to 99 mol % of all functional groups bonded to silicone atoms is a methyl group, and that all other functional groups bonded to silicone atoms is a alkenyl group such as a vinyl group. In such a range, component (A) is not hot-meltable, and can be designed as a component that is particularly superior in coloration resistance, and the like at high temperatures of the cured product thereof. A small amount of a hydroxyl group or an alkoxy group may be included in said component (A).

Component (A) is organopolysiloxane resin that is solid in a solvent-free state, and is characterized in containing in its molecule a siloxane unit represented by $SiO_{4/2}$ making up at least 20 mol % or more of the total siloxane units. Suitably, these branched siloxane units are at least 40 mol % of the total siloxane units, and that they are in particular preferably at least 50 mol %, and in particular in the range of 50 to 90 mol %. R is a monovalent organic group, suitably a functional group selected from a monovalent hydrocarbon group having 1 to 10 carbon atoms, particularly an alkyl group having 1 to 10 carbon atoms such as a methyl group and an alkenyl group, and from the viewpoint of technical effectiveness, R preferably does not substantially contain an aryl group such as a phenyl group.

Suitably, component (A) is an organopolysiloxane resin not having hot-melt properties and is represented by the following (A1) average unit formula: $(R^1_3SiO_{1/2})_a(R^1_2SiO_{2/2})_b(R^1SiO_{3/2})_c(SiO_{4/2})_d(R^2O_{1/2})_e$ (in the formula, each $R^1$ is independently a monovalent hydrocarbon group having 1 to 10 carbon atoms, however, 1 to 12 mol % of all $R^1$ in a molecule is an alkenyl group; each $R^2$ is a hydrogen atom or an alkyl group having 1 to 10 carbon atoms; and a, b, c, d, and e are numbers satisfying the following: $0.10 \leq a \leq 0.60$, $0 \leq b \leq 0.70$, $0 \leq c \leq 0.80$, $0 \leq d \leq 0.65$, $0 \leq e \leq 0.05$, wherein $c+d>0.20$, and $a+b+c+d=1$).

In the average unit formula above, each $R^1$ is independently a monovalent hydrocarbon group having 1 to 10 carbon atoms, such as methyl, ethyl, propyl, butyl, pentyl, hexyl, heptyl, or similar alkyl group; vinyl, allyl, butenyl, pentenyl, hexenyl, or similar alkenyl group; phenyl, tolyl, xylyl, or similar aryl group; benzyl, phenethyl, or similar aralkyl group; and chloromethyl, 3-chloropropyl, 3,3, 3-trifluoropropyl, or similar alkyl halide group. Furthermore, 1 to 12 mol % of all $R^1$ in one molecule is an alkenyl group, and preferable 2 to 10 mol % of all $R^1$ in one molecule is an alkenyl group. If the alkenyl group content is less than the lower limit of the range described above, the mechanical strength (hardness, and the like) of the resulting cured product may be insufficient. On the other hand, if the content of the alkenyl group is below the upper limit of the range described above, the composition containing the component can achieve favorable hot melt performance as an entire composition. Each $R^1$ is preferably a functional group selected from an alkyl group having 1 to 10 carbon atoms such as a methyl group or an alkenyl group such as a vinyl group or a hexenyl group, and from the viewpoint of the technical effect of the invention, R1 preferably does not substantially contain an aryl group such as a phenyl group. If a large amount of aryl groups such as phenyl groups are contained, component (A) itself may become hot-meltable and the technical effect of the present invention may not be achieved, and in the cured product, the effect of reinforcing the cured product peculiar to $SiO_{4/2}$ groups may be reduced.

In the formula, $R^2$ is an alkyl group having a hydrogen atom or 1 to 10 carbon atoms. Examples of the alkyl group for $R^2$ include methyl, ethyl, propyl, butyl, pentyl or hexyl. The relevant functional group $R^2O_{1/2}$ containing $R^2$ corresponds to the hydroxyl group or alkoxy group in component (A).

In the formula, "a" is a number indicating the percentage of siloxane units in the general formula: $R^1_3SIO_{1/2}$. This number satisfies $0.1 \leq a \leq 0.60$, preferably $0.15 \leq a \leq 0.55$. If a is at or above the lower limit of the aforementioned range, then the composition containing the component, the composition as a whole can achieve favorable hot melt properties. On the other hand, if a is less than or equal to the upper limit of the aforementioned range, the mechanical strength (hardness, elongation rate, and the like) of the cured product obtained is not too low.

In the formula, "b" is a number indicating the percentage of siloxane units in the general formula: $R^1_2SiO_{2/2}$. This number satisfies $0 \leq b \leq 0.70$, preferably $0 \leq b \leq 0.60$. If b is less than or equal to the upper limit of the range, the composition containing the component can achieve favorable hot melt performance as a whole composition and a granular composition with little stickiness at room temperature can be obtained.

In the formula, "c" is a number indicating the percentage of siloxane units in the general formula: $R^3SiO_{3/2}$. This number is given by $0 \leq c \leq 0.80$ and preferably satisfies $0 \leq c \leq 0.75$. If c is less than or equal to the upper limit of the range, the composition containing the component can achieve favorable hot melt performance as a whole and a tack-free granular composition with little stickiness at room temperature can be obtained. In the present invention, c may be and is preferred to be 0.

In the formula, d is the ratio of $SiO_{4/2}$ and is a number indicating the ratio of siloxane units of $0.00 \leq d \leq 0.65$, and $0.20 \leq d \leq 0.65$ is preferable, and $0.25 \leq d \leq 0.65$ is particularly preferable. This is because within the above numerical range, the composition containing the component can achieve favorable hot-melt performance as an entire composition, and the resulting cured product has sufficient flexibility.

In the present invention, c or d may be 0, but it is necessary that c+d>0.20. If the value of c+d is less than the lower limit described above, favorable hot-melt performance cannot be achieved for the composition as a whole, and the technical effect of the present invention may not be sufficiently achieved.

In the formula, "e" is a number indicating the percentage of units in the general formula: $R^2O_{1/2}$, wherein the units are a hydroxyl group or alkoxy group bonded to a silicone atom that can be contained in the organopolysiloxane resin. This number satisfies $0 \leq e \leq 0.05$, preferably $0 \leq e \leq 0.03$. If e is below the upper limit of the range, a material that achieves favorable hot melt performance as an entire composition can be obtained. Note that, the sum of a, b, c and d, which is the sum of each siloxane unit, is equal to 1.

In one embodiment of the present invention, component (A) is a microparticulate organopolysiloxane resin having the characteristics described above and can suitably be a spherical organopolysiloxane resin microparticle having an average primary particle diameter of 1 to 20 μm as measured using a laser diffraction/scattering method or the like. By using such a particulate component, the composition can be prepared or produced as a curable granular composition having superior workability and hot-melt properties. Here, the method of manufacturing component (A) is not restricted, and a known method can be used.

The method of producing the microparticulate component (A) includes, for example, a method of pulverizing the organopolysiloxane resin described above using a pulverizer, or a method of direct micronization in the presence of a solvent. The pulverizer may be, for example, but not limited to, a roll mill, a ball mill, a jet mill, a turbo mill, or a planetary mill. Examples of a method of directly micronizing the organopolysiloxane in the presence of a solvent, for example, spraying by a spray dryer, or micronizing using a biaxial kneader or a belt dryer. In obtaining the microparticle component (A), some of component (D) described below, such as a hydrosilylation reaction catalyst, may be particulated together with component (A), but from the viewpoint of storage stability of the resulting composition, it is not desirable to particulate a mixture having a property of curing by heating.

In particular, by using a spray dryer or the like, component (A) having a true spherical shape and an average primary particle diameter of 1 to 500 μm, or suitably 1 to 20 μm, can be produced. The heating and drying temperature of the spray dryer needs to be appropriately set based on the heat resistance of the organopolysiloxane resin particulates and the like. Note that in order to prevent secondary aggregation of the obtained microparticles, the temperature of the organopolysiloxane resin microparticles is preferably controlled below the glass transition temperature thereof. The organopolysiloxane resin particulates thus obtained can be recovered by a cyclone, a bag filter, or the like.

Solvents may be used for the above particulation to the extent that they do not inhibit the curing reaction. Examples of the solvents include, but are not limited to, aliphatic hydrocarbons such as n-hexane, cyclohexane, and n-heptane; aromatic hydrocarbons such as toluene, xylene, and mesitylene; ethers such as tetrahydrofuran and dipropyl ether; silicones such as hexamethyldisiloxane, octamethyltrisiloxane, and decamethyltetrasiloxane; esters such as ethyl acetate, butyl acetate, and propylene glycol monomethyl ether; and ketones such as acetone, methyl ethyl ketone, and methyl isobutyl ketone.

Component (B)

Component (B) is one of the base compounds of the composition, and is an organopolysiloxane resin containing a curing reactive functional group that alone does not have hot-melt properties. When used together with components (A) and (C) in a predetermined quantitative range, hot-melt properties of the entire composition and the coloration resistance of the cured product are achieved. Such a component (B) may be in the form of microparticles alone or together with other components (for example, component (A), which is a non-reactive organopolysiloxane resin, and part of component (D), which is a curing agent), in which case it is preferable that the component is spherical silicone microparticles having an average primary particle diameter of 1 to 20 μm.

Component (B) is an organopolysiloxane resin that does not have hot-melt properties as a whole molecule and is solid in a solvent-free state. Here, the absence of a hot-melt property means that the resin particles, which are component (B), do not exhibit heating and melting behavior independently, and specifically means that they do not have a softening point and melt viscosity. In component (B), such properties are not structurally restricted, but the functional group in the organopolysiloxane resin is preferably a monovalent hydrocarbon group having 1 to 10 carbon atoms, in particular a functional group selected from an alkyl group having 1 to 10 carbon atoms such as a methyl group, and substantially free of aryl groups such as a phenyl group. If a large amount of phenyl groups and the like are included, the component may become hot-meltable and the effect of reinforcing the cured product of $SiO_{4/2}$ groups may be reduced.

Component (B) is an organopolysiloxane resin which, similar to component (A), is in solid form and contains a siloxane unit represented by $SiO_{4/2}$ making up at least 20 mol % or more of the total siloxane units, but is characterized in that it does not have a curing reactive functional group containing at least one carbon-carbon double bond in the molecule. That is, component (B) is characterized in that it does not contain an alkenyl group such as a vinyl group as a functional group in the organopolysiloxane resin. The functional group in this organopolysiloxane is a monovalent hydrocarbon group having 1 to 10 carbon atoms, particularly an alkyl group having 1 to 10 carbon atoms such as a methyl group, and it is preferable that the functional group is substantially free of an aryl group such as a phenyl group.

The functional group bonded to the silicone atom in component (B) is suitably a methyl group or the like that is an alkyl group with 1 to 10 carbon atoms, and 70 to 100 mol % of all functional groups bonded to the silicone atoms are preferably methyl groups, more preferable that 80 to 100 mol % or more are methyl groups, and in particular preferably 88 to 100 mol % or more are methyl groups. In such a range, component (B) can be designed as a component that is not hot-meltable and that is particularly effective in reinforcing the cured product containing siloxane units represented by $SiO_{4/2}$. A small amount of a hydroxyl group or an alkoxy group may be included in said component (B).

Since component (B) does not have a curing reactive group having a carbon-carbon double bond in the molecule, it does not form a cured product by itself. However, it has a reinforcing effect on the cured product and improves the hot melt properties of the entire composition and can be used in combination with component (A), which has curability, and is therefore a necessary component to achieve the technical effects of the present invention.

Component (B) is an organopolysiloxane resin that is solid in a solvent-free state, and is a siloxane unit represented by $SiO_{4/2}$ making up at least 20 mol % or more of the total siloxane units, which is a branched siloxane unit, in the molecule. Suitably, said siloxane units are at least 40 mol % of the total siloxane units, and the siloxane units are preferably 50 mol % or more, and particularly preferably in the range of 50-65 mol %.

Suitably, component (B) is a non-hot-meltable organopolysiloxane resin represented by the following average unit formula (B1): $(R^3{}_3SiO_{1/2})_f(R^3{}_2SiO_{2/2})_g(R^3SiO_{3/2})_h(SiO_{4/2})_i(R^2O_{1/2})_j$ (in the formula, each $R^3$ is independently a monovalent hydrocarbon group having 1 to 10 carbon atoms and not containing a carbon-carbon double bond; $R^2$ is a hydrogen atom or an alkyl group having 1 to 10 carbon atoms; and f, g, h, i, and j are numbers satisfying the following: $0.35 \leq f \leq 0.55$, $0 \leq g \leq 0.20$, $0 \leq h \leq 0.20$, $0.45 \leq i \leq 0.65$, $0 \leq j \leq 0.05$, and $f+g+h+i=i$).

In the above average unit formula, each $R^3$ independently has from 1 to 10 carbon atoms, and is a monovalent hydrocarbon group that does not contain any carbon-carbon double bonds, such as methyl, ethyl, propyl, butyl, pentyl, hexyl, heptyl, or similar alkyl group; phenyl, tolyl, xylyl, or similar aryl group; benzyl, phenethyl, or similar aralkyl group; and chloromethyl, 3-chloropropyl, 3,3,3-trifluoropropyl, or similar alkyl halide group; and the like. Herein, from the viewpoint of industrial production and the technical effect of the invention, 70 mol % or more of all $R^3$ in one molecule is preferably an alkyl group having 1 to 10 carbon atoms, such as a methyl group, and particularly preferable that 88 mol % or more is a methyl group. On the other hand, $R^3$ is preferably substantially free of aryl groups such as a phenyl group. If a large amount of aryl groups such as phenyl groups is contained, component (B) itself may become hot-meltable and the technical effect of the present invention may not be achieved, and the coloration resistance of the cured product at high temperatures may deteriorate.

In the formula, $R^2$ is synonymous with the groups described above.

In the formula, "f" is a number indicating the percentage of siloxane units in the general formula: $R^3{}_3SiO_{1/2}$. This number satisfies $0.35 \leq f \leq 0.55$, preferably $0.40 \leq f \leq 0.50$. If "f" is at or above the lower limit of the aforementioned range, then the composition containing the component, the composition as a whole, can achieve favorable hot melt properties. On the other hand, if "f" is less than or equal to the upper limit of the aforementioned range, the mechanical strength (hardness, and the like) of the cured product obtained is not too low.

In the formula, "g" is a number indicating the percentage of siloxane units in the general formula: $R^1{}_2SiO_{2/2}$. This number satisfies $0 \leq g \leq 0.20$, preferably $0 \leq g \leq 0.10$. If "g" is less than or equal to the upper limit of the range, the composition containing the component can achieve favorable hot melt performance as a whole composition and a granular composition with little stickiness at room temperature can be obtained. In the present invention, "g" may be and is preferred to be 0.

In the formula, "h" is a number indicating the percentage of siloxane units in the general formula: $R^1{}_3SiO3/2$. This number satisfies $0 \leq h \leq 0.20$, preferably $0 \leq h \leq 0.10$. If "h" is less than or equal to the upper limit of the range, the composition containing the component can achieve favorable hot melt performance as an entire composition and a granular composition with little stickiness at room temperature can be obtained. In the present invention, "h" may be and is preferred to be 0.

In the formula, "i" is the ratio of $SiO_{4/2}$ and is a number indicating the ratio of siloxane units where $0.45 \leq i \leq 0.65$, and $0.40 \leq d \leq 0.65$ is preferable, and $0.50 \leq d \leq 0.65$ is particularly preferable. Within this numerical range, the composition containing this component can achieve favorable hot melt performance as a whole, excellent mechanical strength of the resulting cured product, and good workability without stickiness as a whole.

In the formula, "j" is a number indicating the percentage of units in the general formula: $R^2O_{1/2}$, wherein the units are a hydroxyl group or alkoxy group bonded to a silicone atom that can be contained in the organopolysiloxane resin. This number satisfies $0 \leq j \leq 0.05$, preferably $0 \leq j \leq 0.03$. If e is below the upper limit of the range, a material that achieves favorable hot melt performance as an entire composition can be obtained. Note that, the sum of e, f, g, h, which is the sum of each siloxane unit, is equal to 1.

In one embodiment of the present invention, component (B) is a microparticulate organopolysiloxane resin having the characteristics described above and is suitably a spherical organopolysiloxane resin microparticle having an average primary particle diameter of 1 to 20 μm as measured using a laser diffraction/scattering method or the like. By using such a particulate component, the composition can be prepared or produced as a curable granular composition having superior workability and hot-melt properties. Herein, the method for manufacturing component (B) include the same methods as those indicated for component (A) above.

The amount of component (B) used is in the range of 100 to 1,000 mass parts relative to 100 mass parts of component (A), with a range of 300 to 600 mass parts being preferred, and a range of 350 to 600 mass parts being particularly preferred. That is, a small amount of component (A) is used relative to component (B). Component (B) does not itself have curability, but by adding a small amount of component (A) and using them together in the present composition, the cured product of the present composition can be suppressed from having an excessively low elastic modulus at high temperatures, and can be used in a wide range of applications. On the other hand, if the amount of component (A) used is less than the lower limit, it becomes difficult to suppress the content of a curing reactive functional group per 100 g of silicone component in the composition below a certain level, which is a characteristic of the present invention, and when a large amount of functional filler is blended in the composition, it may become impossible to achieve the technical effects of high stress relief properties and small thermal expansion of the cured product, and flexibility may become insufficient.

Component (C)

Component (C) is one of the base compounds of the present composition, and is a straight or branched chain organopolysiloxane that is liquid at 25° C. and has a curing reactive functional group containing at least two carbon-carbon double bonds in the molecule. This manner of curing reactive chain-like organopolysiloxane, when mixed with the aforementioned solid organopolysiloxane resin, develops hot melt properties as a whole.

Similar to component (A), component (C) must have a curing reactive group having a carbon-carbon double bond in the molecule. This type of a curing reactive group being hydrosilylation reactive or a organic peroxide curing functional group that forms a cured product based on a crosslinking reaction with other components. This manner of curing reactive group is an alkenyl group or an acrylic group, and examples are the same groups described above, and a vinyl group or a hexenyl group are in particular preferable.

Component (C) is a straight or branched chain organopolysiloxane in a liquid state at 25° C. (room temperature), and when mixed with component (A) in a solid state at room temperature and with component (B), the composition as a whole exhibits hot melt-ability.

The structure thereof can be based on a branched-chain organopolysiloxane having a small number of branched siloxane units (for example, T units represented by the general formula: $R^4SiO_{3/2}$ ($R^4$ is independently a monovalent hydrocarbon group having 1 to 10 carbon atoms) or Q units represented by $SiO_{4/2}$) and is suitably a straight-chain organopolysiloxane represented by the following structural formula (C1): $R^4{}_3SiO(SiR^4{}_2O)_kSiR^4{}_3$, (In the formula, each $R^4$ is independently a monovalent hydrocarbon group having 1 to 10 carbon atoms, except that at least two of the $R^4$ in one molecule is an alkenyl group, and k is a number from 20 to 5,000). Suitably, a straight-chain diorganopolysiloxane capped at both molecular terminals with one each alkenyl group is preferred.

In the formula, each $R^4$ is independently a monovalent hydrocarbon group having 1 to 10 carbon atoms, such as methyl, ethyl, propyl, butyl, pentyl, hexyl, heptyl, or similar alkyl group; vinyl, allyl, butenyl, pentenyl, hexenyl, or similar alkenyl group; phenyl, tolyl, xylyl, or similar aryl group; benzyl, phenethyl, or similar aralkyl group; and chloromethyl, 3-chloropropyl, 3,3,3-trifluoropropyl, or similar alkyl halide group. Furthermore, at least two of the $R^4$ in one molecule is an alkenyl group, preferably a vinyl group. Each $R^4$ is also preferably a functional group preferably selected from an alkyl group having 1 to 10 carbon atoms such as a methyl group and an alkenyl group such as a vinyl group or a hexenyl group, and it is particularly preferable that of all $R^4$, at least two are alkenyl groups, and the remaining $R^4$ are methyl groups. Note, from the viewpoint of the technical effect of the invention, it is preferable that $R^4$ is substantially free of an aryl group such as a phenyl group. If a large amount of aryl groups such as phenyl groups are contained therein, the coloration resistance of the cured product at high temperatures may deteriorate. Particularly suitable is having an alkenyl group such as a vinyl group at both molecular terminals, the rest of the $R^4$ being methyl groups.

In the formula, k is a number between 20 and 5,000, preferably between 30 and 3,000, and particularly preferably between 45 and 800. If k is at or above the lower limit of the aforementioned range, a granular composition having little stickiness at room temperature can be obtained. On the other hand, if k is below the upper limit of the aforementioned range, the composition as a whole can achieve favorable hot melt performance.

Although there are no limitations regarding combining the above component (A), component (B), and component (C), it is preferable to select a combination in which the molecular weights are different, such as component (A) or component (B), which are organopolysiloxane resins, and component (C), which is a straight or branched chain organopolysiloxane. That is, a combination of a relatively small molecular weight components (A) and (B) and a relatively large molecular weight component (C); or a combination of a relatively large molecular weight components (A) and (B) and a relatively small molecular weight component (C) is preferred from the viewpoint of atomization. On the other hand, if component (A)/component (B) and component (C), which have relatively small molecular weights are combined, they may be incompatible and atomization will not be feasible. In the combination of a high molecular weight MQ resin and a large molecular weight (long chain) vinyl polysiloxane disclosed in Patent Document 3, the melt viscosity of the mixture tends to be high, and producing a composition with low melt viscosity in the composition of the present invention to which the functional filler described below is added can become difficult.

Here, in order to achieve hot-melt properties as an entire composition, the mass ratio of component (C), which is a straight or branched-chain organopolysiloxane, relative to the sum of components (A) and (B), which are organopolysiloxane resins, should be in the range of 90:10 to 50:50. Furthermore, in the present invention, in order to suppress the content of the curing reactive functional group in the silicone component below a certain level, the content of component (C) is preferably in the range of 65 to 300 mass parts for 100 mass parts of component (A), and the range of 65 to 200 mass parts is more preferable. If the content of component (C) is in the range described above, the composition can achieve favorable hot-melt properties and the mechanical strength of the resulting cured product can be increased, and the stickiness of the resulting granular composition can be reduced at room temperature, thereby improving the workability thereof.

Component (D) is a curing agent for curing components (A) and (C) described above, and is specifically one or more curing agents selected from (d1) or (d2) below. Two or more of these curing agents may be used in combination, for example, the cure system may include both a component (d1) and a component (d2).

(d1) an organic peroxide, or
(d2) an organohydrogenpolysiloxane having at least two silicon-bonded hydrogen atoms in the molecule and a hydrosilylation reaction catalyst (d1) Organic peroxide is a component that cures components (A) to (C) described above by heating, and examples include alkyl peroxides, diacyl peroxides, ester peroxides, and carbonate peroxides. Component (d1) can also be reacted with a part of the component (B).

Examples of alkyl peroxides include dicumyl peroxide, di-tert-butyl peroxide, di-tert-butylcumyl peroxide, 2,5-dimethyl-2,5-di(tert-butylperoxy)hexane, 2,5-dimethyl-2,5-di(tert-butylperoxy)hexyne-3, tert-butylcumyl, 1,3-bis(tert-butylperoxyisopropyl)benzene, and 3,6,9-triethyl-3,6,9-trimethyl-1,4,7-triperoxonan.

Examples of diacyl peroxides include benzoyl peroxide, lauroyl peroxide, and decanoyl peroxide.

Examples of ester peroxides include 1,1,3,3-tetramethylbutylperoxyneodecanoate, α-cumylperoxyneodecanoate, tert-butylperoxyneodecanoate, tert-butylperoxyneoheptanoate, tert-butylperoxypivalate, tert-hexylperoxypivalate, 1,1,3,3-tetramethylbutylperoxy-2-ethylhexanoate, tert-amylperoxyl-2-ethylhexanoate, tert-butylperoxy-2-ethylhexanoate, tert-butylperoxyisobutyrate, di-tert-butylperoxyhexahydroterephthalate, tert-amylperoxy-3,5,5-trimethylhexanoate, tert-butylperoxy-3,5,5-trimethylhexanoate, tert-butylperoxyacetate, tert-butylperoxybenzoate, and di-butylperoxytrimethyladipate.

Examples of carbonate peroxides include di-3-methoxybutyl peroxydicarbonate, di(2-ethylhexyl)peroxydicarbonate, diisopropyl peroxycarbonate, tert-butyl peroxyisopropylcarbonate, di(4-tert-butylcyclohexyl)peroxydicarbonate, dicetyl peroxydicarbonate, and dimyristyl peroxydicarbonate.

This organic peroxide preferably has a 10-hour half-life temperature of not lower than 90° C. or not lower than 95° C. Examples of such organic peroxide include dicumyl peroxide, di-tert-butyl peroxide, di-tert-hexyl peroxide, tert-butylcumyl peroxide, 2,5-dimethyl-2,5-di(tert-butylperoxy) hexane, 1,3-bis(tert-butylperoxyisopropyl)benzene, di-(2-tert-butylperoxyisopropyl)benzene, and 3,6,9-triethyl-3,6,9-trimethyl-1,4,7-triperoxonan.

While not limited thereto, the content of the (d1) organic peroxide is preferably within the range of 0.05 to 10 mass parts, or within the range of 0.10 to 5.0 mass parts, with regards to 100 mass parts of component (A) to (C).

The organohydrogenpolysiloxane having at least two silicon-bonded hydrogen atoms in the (d2) molecule and the hydrosilylation reaction catalyst are components that cure the composition by an addition reaction (hydrosilylation reaction) of the organohydrogenpolysiloxane, a crosslinking agent, with the carbon-carbon double bond in components (A) and (C) in the presence of the hydrosilylation reaction catalyst.

The structure of the crosslinking agent, organohydrogenpolysiloxane, is not particularly limited and may be straight-chain, branched-chain, cyclic, or resinous. In other words, component (d2) may be an organohydrogenpolysiloxane having, as the main constituent unit, a hydrogen organosiloxy unit represented by $HR_2SiO_{1/2}$ ($D^H$ unit, wherein R is independently a monovalent organic group), and at the end thereof a hydrogen diorganosiloxy unit represented by $HR_2SiO_{1/2}$ ($M^H$ unit, wherein R is independently a monovalent organic group). In particular, in the case of applications other than the molding process described below, even if the curable silicone composition is a chain-like organohydrogenpolysiloxanes made up of the $D^H$ units described above, and the like, sufficient curing is possible for practical use.

On the other hand, when the curable silicone composition is used in the molding process, since the content of the curable reactive functional group containing a carbon-carbon double bond in the composition is small, from the viewpoint of curing speed, molding, and curing properties thereof, the organohydrogenpolysiloxane includes monoorganosiloxy units represented by $RSiO_{3/2}$ (T unit, where R is a monovalent organic group or a silicon-bonded hydrogen atom) or a siloxy unit (Q unit) represented by $SiO_{4/2}$, and at least two hydrogen diorganosiloxy units represented by $HR_2SiO_{1/2}$ ($M^H$ unit, wherein R is independently a monovalent organic group), and the organohydrogenpolysiloxane resin having the $M^H$ unit at the molecular terminal is preferred.

A particularly suitable organohydrogenpolysiloxane is an organohydrogenpolysiloxane resin represented by the following average unit formula: $(R^5_3SiO_{1/2})_l(R^6_2SiO_{2/2})_m(R^6SiO_{3/2})_n(SiO_{4/2})_p(R^2O_{1/2})_q$.

In the formula, each $R^5$ is a hydrogen atom or the same or different monovalent hydrocarbon group having 1 to 10 carbon atoms without an aliphatic unsaturated carbon bond, wherein at least two $R^5$ in one molecule are hydrogen atoms. Examples of the monovalent hydrocarbon group $R^5$, other than hydrogen atoms, include methyl, ethyl, propyl, butyl, pentyl, hexyl, heptyl, or similar alkyl group; phenyl, tolyl, xylyl, or similar aryl group; benzyl, phenethyl, or similar aralkyl group; and chloromethyl, 3-chloropropyl, 3,3,3-trifluoropropyl, or similar alkyl halide group; and the like. From an industrial viewpoint, methyl groups or phenyl groups are preferred.

In the formula, $R^6$ is a monovalent hydrocarbon group having 1 to 10 carbon atoms without an aliphatic unsaturated carbon bond, for example, the same group as the monovalent hydrocarbon group described above. On the other hand, $R^2$ is a hydrogen atom or an alkyl group having 1 to 10 carbon atoms, for example, $R^2$ in the above components (A) or (B).

In the formula, l, m, n and p are numbers that satisfy the following: $0.1 \le l \le 0.80$, $0 \le m \le 0.5$, $0 \le n \le 0.8$, $0 \le p \le 0.6$, $0 \le q \le 0.05$, wherein $n+p > 0.1$ and $l+m+n+p=1$. Here, when the present composition is used in the molding process, the organohydrogenpolysiloxanes resin that is part of component (d2) are specifically preferred to be $M^HMT$ resin, $M^HMTT^H$ resin, $M^HMTQ$ resin, $M^HMQ$ resin, $M^HMTT^HQ$, or $M^HQ$ resin.

Particularly suitable is the organohydrogenpolysiloxanes which is part of component (d2), the $M^HQ$ resin represented by:

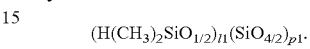

Here, $l1+p1=1$, and it is preferable to have $0.1 \le l1 \le 0.80$ and $0.20 \le p1 \le 0.90$.

Similarly, the organohydrogenpolysiloxane that is part of component (d2) may include straight-chain diorganopolysiloxane, organohydrogenpolysiloxane, or diorganopolysiloxane whose molecular chain ends are capped with silicon-bonded hydrogen atoms or trimethylsiloxy groups. The degree of siloxane polymerization of these straight-chain organohydrogenpolysiloxanes is not particularly limited, but is in the range of 2 to 200, and is preferably in the range of 5 to 100.

The amount of the organohydrogenpolysiloxane, which is a part of component (d2), is an amount sufficient to cure the curable silicone composition of the present invention and relative to the curable reactive functional group (for example, an alkenyl group such as a vinyl group) containing a carbon-carbon double bond in components (B) and (C), the molar ratio of the silicon-bonded hydrogen atom in the organohydrogenpolysiloxane is 0.5 or more and preferably in the range of 0.5 to 20. In particular, when component (d2) includes the organohydrogenpolysiloxane resin described above, the amount thereof is set so that, relative to the curable reactive functional group containing a carbon-carbon double bond in components (B) and (C), the molar ratio of the silicon-bonded hydrogen atom in the organohydrogenpolysiloxane resin is in the range of 0.5 to 20 and preferably in the range of 1.0 to 10.

Examples of the hydrosilylation reaction catalyst that is a part of component (d2) include platinum-based catalysts, rhodium-based catalysts, and palladium-based catalysts. Platinum-based catalysts are preferred due to the ability to remarkably promote curing of the present composition. Examples of platinum-based catalysts include platinum fine powder, chloroplatinic acid, an alcohol solution of chloroplatinic acid, a platinum-alkenyl siloxane complex, a platinum-olefin complex, a platinum-carbonyl complex, and a catalyst in which these platinum-based catalysts are dispersed or encapsulated with a thermoplastic resin such as silicone resin, polycarbonate resin, acrylic resin or the like, with a platinum-alkenyl siloxane complex particularly preferable. Examples of alkenylsiloxanes include: 1,3-divinyl-1,1,3,3-tetramethyldisiloxane; 1,3,5,7-tetramethyl-1,3,5,7-tetravinylcyclotetrasiloxane; alkenyl siloxanes obtained by substituting a portion of methyl groups of the alkenylsiloxanes with an ethyl group, a phenyl group, or the like; and alkenylsiloxanes obtained by substituting a portion of vinyl groups of these alkenylsiloxanes with an allyl group, a hexenyl group, or the like. In particular, 1,3-divinyl-1,1,3,3-tetramethyldisiloxane is preferably used because of the favorable stability of this platinum-alkenylsiloxane complex, and is preferably added in the form of a complex alkenylsiloxane solution. In addition, in terms of improving the workability as well as the pot life of the composition, a platinum containing hydrosilylation reaction catalyst in microparticulate dispersed and encapsulated with thermoplastic resin may be used. As the catalyst for promoting the hydrosilylation reaction, a non-platinum based metal catalyst such as iron, ruthenium, iron/cobalt, or the like may be used.

The amount of the hydrosilylation reaction catalyst, which is a part of component (d2), should be an amount in which a metal atom is in the range of 0.01 to 500 ppm, 0.01 to 100 ppm, or preferably 0.01 to 50 ppm by mass relative to the entire composition.

Particularly suitable components (d2) include at least (d2-1) an organohydrogenpolysiloxanes resin represented by the above-described average unit formula and a hydrosilylation reaction catalyst.

When the hydrosilylation reaction catalyst described above is used as a part of component (D), it is preferable to include it in the organopolysiloxane microparticles such as the components (A) and (B) when they are produced from the viewpoint of the storage stability of this curable silicone composition. However, the entire mixture made up of the microparticles preferably does not become curing reactive on its own.

In addition to the above-described components (A) to (D), the curable silicone composition of the present invention can improve the problem of stickiness of the entire composition at room temperature, and when cured at high temperature after heating and melting (hot-melting), from the viewpoint of providing a cured product having the desired functions and excellent hardness and toughness at room to high temperature, it is preferable to further include a (E) functional filler.

The functional filler, which is component (E), is a component that imparts mechanical or other properties to the cured product, and examples include inorganic fillers, organic fillers, and mixtures thereof. Examples of the inorganic fillers include a reinforcing filler, a white pigment, a thermally conductive filler, an electrically conductive filler, a phosphor, and mixtures of at least two of these, and examples of organic fillers include a silicone resin filler, a fluorine resin filler, and a polybutadiene resin filler. The shape of these fillers is not particularly limited, and may be spherical, spindle-shaped, flat, needle-shaped, amorphous, or the like.

When the composition is used in applications such as an encapsulant, a protective agent, an adhesive, and the like, a reinforcing filler is preferably included in at least a part of component (E) from the viewpoint of improving the mechanical strength, protectiveness and adhesiveness of the cured product.

Reinforcing fillers may be added to improve the mechanical strength of the cured product, to improve protection and adhesion, and to maintain a solid particle shape as a binder filler in the curable granular silicone composition before curing. Examples of this type of reinforcing filler include fumed silica, precipitated silica, fused silica, calcined silica, fumed titanium dioxide, quartz, calcium carbonate, diatomaceous earth, aluminum oxide, aluminum hydroxide, zinc oxide, and zinc carbonate. These reinforcing fillers may also be surface treated with organoalkoxysilanes such as methyltrimethoxysilane; organohalosilanes such as trimethylchlorosilane; organosilazanes such as hexamethyldisilazane; siloxane oligomers such as α,ω-silanol group-blocked dimethylsiloxane oligomers, α,ω-silanol group-blocked methylphenylsiloxane oligomers, α,ω-silanol group-blocked methylvinylsiloxane oligomers, and the like. The particle size of the reinforcing filler is not restricted, but the median diameter measured by a laser diffraction scattering type particle size distribution measurement is preferably within a range of 1 nm to 500 μm. Further, as the reinforcing filler, a fibrous filler such as calcium metasilicate, potassium titanate, magnesium sulfate, sepiolite, zonolite, aluminum borate, rock wool, glass fiber, or the like may be used.

Further, a white pigment, a thermally conductive filler, an electrically conductive filler, or a phosphor may be blended for the purpose of imparting other functions to the cured product obtained using the composition. Organic fillers such as silicone elastomer particles may also be blended for the purpose of improving the stress relief properties of the cured product.

The white pigment is a component that imparts whiteness to the cured product and improves light reflectivity, and the cured product resulting from curing the composition by blending the component can be used as a light reflective material for light emitting/optical devices. Examples of the white pigment include metal oxides such as titanium oxide, aluminum oxide, zinc oxide, zirconium oxide, magnesium oxide, and the like; hollow fillers such as glass balloons, glass beads, and the like; and other barium sulfate, zinc sulfate, barium titanate, aluminum nitride, boron nitride, and antimony oxide. Titanium oxide has high optical reflectivity and concealing properties, and is therefore preferable. Furthermore, aluminum oxide, zinc oxide, and barium titanate have high optical reflectivity of a UV region, and are therefore preferable. The average particle size or shape of the white pigment is not restricted, but the average particle diameter is within a range of 0.05 to 10.0 μm and preferably within a range of 0.1 to 5.0 μm. Furthermore, a surface of the white pigment can be treated by a silane coupling agent, silica, aluminum oxide, and the like.

A thermally conductive filler or an electrically conductive filler is added to the cured product for the purpose of imparting thermal conductivity/electrical conductivity thereto, and specific examples include a metallic fine powder such as gold, silver, nickel, copper or aluminum; a fine powder such as ceramic, glass, quartz or organic resin, the surface thereof on which a metal such as gold, silver, nickel, or copper is deposited or plated; a metallic compound such as aluminum oxide, magnesium oxide, aluminum nitride, boron nitride or zinc oxide or the like; and graphite, and mixtures of two or more of these. When electrical insulation is required for the present composition, a metal oxide-based powder or a metal nitride-based powder is preferable, and in particular, an aluminum oxide powder, a zinc oxide powder, or an aluminum nitride powder is preferable and combinations of type, particle diameter, and particle shape, and the like can be used according to these thermal conductivity/electrical conductivity requirements.

Phosphor is a component that is blended to convert the emission wavelength from a light source (optical semiconductor device) when the cured product is used as a wavelength conversion material. There is no particular limitation on this phosphor, and examples of the phosphor include yellow, red, green, and blue light phosphors, which include oxide phosphors, oxynitride phosphors, nitride phosphors, sulfide phosphors, oxysulfide phosphors, and the like, which are widely used in light emitting diodes (LED).

Silicone microparticles include non-reactive silicone resin microparticles and silicone elastomer microparticles, but silicone elastomer microparticles are suitably exemplified from the viewpoint of improving cured product flexibility or stress relief properties.

The silicone elastomer fine particles are a crosslinked product of linear diorganopolysiloxane comprised of primarily of diorganosiloxy units (D-units). The silicone elastomer fine particles can be prepared by a crosslinking reaction of diorganopolysiloxane by a hydrosilylation reaction, a condensation reaction of a silanol group, or the like, and in particular, the silicone elastomer fine particles can be suitably obtained by a crosslinking reaction of organohydrogenpolysiloxane having a silicone bonded hydrogen atom at a side chain or a terminal with diorganopolysiloxane having an unsaturated hydrocarbon group such as an alkenyl group at a side chain or a terminal under a hydrosilylation reaction catalyst. The silicone elastomer fine particles may have various shapes such as spherical, flat, and irregular shapes, but are preferably spherical in terms of dispersibility, and among these, true spherical is more preferable. Commercial products of such silicone elastomer fine particles include, for example, "Torefil-E series" and "EP Powder series" manufactured by Dow Corning Toray Company, Ltd., and "KMP series" manufactured by Shin-Etsu Chemical Co., Ltd.

For the purpose of stably blending the functional filler above in the present composition or the like, the filler surface may be treated using a specific surface treatment agent in the range of 0.1 to 2.0 mass %, 0.1 to 1.0 mass %, or 0.2 to 0.8 mass % of the total mass of component (E). Examples of these surface treatment agents include, methylhydrogen polysiloxane, silicone resins, metal soaps, silane coupling agents, perfluoroalkyl silanes, as well as fluorine compounds such as perfluoroalkyl phosphate ester salts.

The amount of component (E) is not restricted, but the amount is preferably within a range of 10 to 1,000 mass parts, within a range of 10 to 750 mass parts, or within a range of 10 to 500 mass parts with regards to 100 mass parts of the sum of components (A) to (C) in order for the obtained cured product to have superior hardness and mechanical strength.

The curable silicone composition of the present invention comprises the components (A) to (E) described above, and from the viewpoint of further improving the melting characteristics thereof, (F) hot-melt particles with a drip point of 50° C. or higher and a melt viscosity measured by a rotational viscometer at 150° C. of less than 10 Pas may be added and is preferable.

The type of component (F) is not particularly limited, and one or more types selected from various hot-melt synthetic resins, waxes, fatty acid metal salts, and the like can be used, as long as the conditions of the drip point described above and kinematic viscosity at 150° C. during melting are satisfied. Component (F) exhibits low kinematic viscosity at high temperatures (150° C.) and forms a melt with superior flowability. Furthermore, by combining the components (A) to (C) described above, component (F) in the melt that makes up the present composition spreads quickly throughout the composition at high temperature, thereby lowering the visicity between the substrate surface to which the molten composition is applied and the entire composition, rapidly lowering the surface friction of the substrate and the molten composition, and significantly increasing the fluidity of the entire composition. Therefore, the viscosity and flowability of the molten composition can be greatly improved by adding only a very small amount to the total amount of other components.

Component (F) may be a petroleum wax such as paraffin as long as it satisfies the conditions of drip point and kinematic viscosity at the time of melting described above, but from the viewpoint of the technical effect of the present invention, a hot melt component that makes up a fatty acid metal salt is preferable, and a metal salt of a higher fatty acid such as stearic acid, palmitic acid, oleic acid and isononanoic acid is particularly preferable. Here, the types of the fatty acid metal salts described above are also not particularly limited, and suitable examples include alkali metal salts such as lithium, sodium, potassium, and the like; alkaline earth metal salts such as magnesium, calcium, barium, and the like; or zinc salts.

Particularly suitable as component (F) are fatty acid metal salts having a (FO) free fatty acid content of 5.0% or less, 4.0% or less, and more preferably fatty acid metal salts with 0.05 to 3.5% of free fatty acid content. Examples of such a component (FO) include at least one or more stearic acid metal salts. From the viewpoint of the technical effect of the present invention, component (E0) preferably consists substantially only of one or more stearic acid metal salts, a hot-melt component with a melting point of 150° C. or less selected from calcium stearate (melting point 150° C.), zinc stearate (melting point 120° C.), and magnesium stearate (melting point 130° C.).

Regarding the amount of component (F) used, with the entire composition taken as 100 mass parts, the content of component (FO) is in the range of 0.01 to 5.0 mass parts, and may be 0.01 to 3.5 mass parts or 0.01 to 3.0 mass parts. If the amount of the component (F) used exceeds the upper limit, the adhesiveness and mechanical strength of the cured product obtained from the curable silicone composition of the present invention may be insufficient. If the amount of component (E) used is less than the lower limit, sufficient fluidity while heating and melting may not be achieved.

The present composition may contain a curing retardant or an adhesion imparting agent as other optional components as long as the object of the present invention is not impaired.

Examples of the curing retardant include: alkyne alcohols such as 2-methyl-3-butyne-2-ol, 3,5-dimethyl-1-hexyne-3-ol, 2-phenyl-3-butyne-2-ol, and 1-ethynyl-1-cychlohexanol; enyne compounds such as 3-methyl-3-pentene-1-yne, and 3,5-dimethyl-3-hexene-1-yne; alkenyl group-containing low molecular weight siloxanes such as tetramethyltetravinylcyclotetrasiloxane and tetramethyltetrahexenylcyclotetrasiloxane; and alkynyloxysilanes such as methyl tris(1,1-dimethyl propynyloxy)silane and vinyl tris(1,1-dimethyl propynyloxy)silane. The content of the curing retardant is not limited, but is preferably within the range of 10 to 10000 ppm in terms of mass units, with regard to the composition.

As the adhesion imparting agent, an organosilicone compound having at least one alkoxy group bonded to a silicone atom in one molecule is preferable. Examples of this alkoxy group include a methoxy group, an ethoxy group, a propoxy group, a butoxy group, and a methoxyethoxy group, with a methoxy group particularly preferable. Moreover, examples of groups other than alkoxy group, bonded to the silicone atom of the organosilicone compound include: halogen substituted or unsubstituted monovalent hydrocarbon groups such as an alkyl group, an alkenyl group, an aryl group, an aralkyl group, and a halogenated alkyl group; glycidoxyalkyl groups such as a 3-glycidoxypropyl group and a 4-glycidoxybutyl group; epoxycyclohexylalkyl groups such as a 2-(3,4-epoxycyclohexyl)ethyl group and a 3-(3,4-epoxycyclohexyl)propyl group; epoxyalkyl groups such as a 3,4-epoxybutyl group and a 7,8-epoxyoctyl group; acryl group-containing monovalent organic groups such as a 3-methacryloxypropyl group; and hydrogen atoms. This organosilicone compound preferably has a group that may react with an alkenyl group or a silicon-bonded hydrogen atom in this composition, and specifically, preferably has a silicon-bonded hydrogen atom or an alkenyl group. Moreover, because favorable adhesion can be imparted to various substrates, this organosilicone compound preferably has at least one epoxy group-containing monovalent organic group per one molecule. Examples of such an organosilicone compound include an organosilane compound, an organosiloxane oligomer, and an alkyl silicate. Exemplary molecular structures of this organosiloxane oligomer or alkyl silicate include a linear structure, a partially branched linear structure, a branched structure, a cyclic structure, and a network structure, among which a linear structure, a branched structure, and a network structure are particularly preferable. Examples of the organic silicone compound include silane compounds such as 3-glycidoxypropyltrimethoxysilane, 2-(3,4-epoxycyclohexyl) ethyltrimethoxysilane, and 3-methacryloxypropyltrimethoxysilane; siloxane compounds with at least one of each of a silicon-bonded alkenyl group or a silicon-bonded hydrogen atom and a silicon-bonded alkoxy group in one molecule; a silane compound or siloxane compound having at least one silicon-bonded alkoxy group; a mixture of siloxane compounds having at least one each of silicon-bonded alkenyl group and silicon-bonded alkenyl group in one molecule, a reaction mixture of an amino group-containing organoalkoxysilane and an epoxy group-containing organoalkoxysilane, and an organic compound having at least two alkoxysilyl groups containing bonds other than silicon-oxygen bonds between their silyl groups in one molecule; general formula: $R^a{}_n Si(OR^b)_{4-n}$ (wherein, Ra represents an organic group containing a monovalent epoxy group, Rb represents an alkyl group having from 1 to 6 carbon atoms, or a hydrogen atom. n represents a number within a range of 1 to 3), representing epoxy group-containing silane or a partially hydrolyzed condensate, reaction mixture of vinyl group-containing siloxane oligomer (including chain or ring shaped structure), and epoxy group-containing trialkoxysilane, methyl polysilicate, ethyl polysilicate, and epoxy group-containing ethyl polysilicate. The adhesion imparting agent is preferably in the form of a low viscosity liquid, and the viscosity thereof is not limited, but is preferably within the range of 1 to 500 mPa·s at 25° C. In addition, while not limited thereto, the content of this adhesion imparting agent is preferably within the range of 0.01 to 10 mass parts with regards to 100 mass parts of the total of the present composition.

Furthermore, the composition may contain, as other optional components, heat resistance agents such as iron oxide (red iron oxide), cerium oxide, cerium dimethyl silanolate, fatty acid cerium salt, cerium hydroxide, zirconium compound, and the like; and dyes, pigments other than white, flame retardant agents, and the like may be contained as long as the purpose of the present invention is not impaired.

The present composition can be used after being formed into pellets or sheets. The pellet shape is obtained by compression molding of the present composition, and is excellent in workability and curability. The "pellet" may also be referred to as a "tablet". The shape of the pellet is not limited, but is usually spherical, elliptical spherical, or cylindrical. The size of the pellet is not limited, and for example, the pellet has an average particle diameter or a circle equivalent diameter of 500 µm or more.

The composition may be molded into a sheet and used. For example, a sheet made of a curable silicone composition having an average thickness of 100 to 1,000 µm is advantageous in that it has hot melt properties and heating-curability at high temperatures, and so in particular, demonstrates excellent workability and melting characteristics when used in compression molding or the like.

Such a sheet-like composition may be produced by integrating the curable silicone composition obtained by the method described above, in particular the granular curable silicone composition, with a uniaxial or biaxial continuous kneader at low temperature, and then producing it to a predetermined thickness through two rolls or the like.

Use as Laminates and Film Adhesives

The composition can be used in sheet form, in particular as a laminate body, having a structure including a sheet-like member that makes up the curable silicone composition described above between two film-like substrates provided with a release layer.

Although there are no particular restrictions on the manufacturing method of the laminate, it may be manufactured using organopolysiloxane resin particles as the raw material (Method A) or organopolysiloxane resin in solid form at room temperature and optionally chain-like diorganopolysiloxane dispersed in an organic solvent, and after the organic solvent is removed, the hot-melt solids may be used as raw material (hot bulk method) (Method B).

Specifically, the former (Method A) contains the following steps:

Step 1: A step of mixing organopolysiloxane resin particles, curing agent, and optionally, in some cases, functional fillers;

Step 2: A step of kneading the mixture obtained in step 1 while heating and melting at a temperature of 120° C. or lower.

Step 3: A step wherein the mixture after heating and melting and mixing obtained in Step 2 is laminated between two films, each having at least one release surface, to form a laminate body; and Step 4: A step of stretching the mixture in the laminate body obtained in Step 3 between rolls to form a curable hot melt silicone sheet having a specific film thickness.

On the other hand, the latter (Method B) is a process of:

Step 1: A step of obtaining a hot-melt solid by removing an organic solvent at a temperature of 150° C. or higher from a solution in which an organopolysiloxane resin in a solid state at room temperature and optionally a diorganopolysiloxane in a chain state are dispersed or dissolved in an organic solvent;

Step 2: A step where after adding all the curing agents to the hot-meltable solids obtained in Step 1, the mixture is kneaded while heating and melting at a temperature below 120° C.;

Step 3: A step wherein the mixture after heating and melting obtained in Step 2 is laminated between two films, each having at least one release surface, to form a laminate body; and Step 4: A step of stretching the mixture in the laminate body obtained in Step 3 between rolls to form a curable hot melt silicone sheet having a specific film thickness.

For example, for either of the manufacturing methods (Method A or Method B), Step 3 and Step 4 can be continuous and integrated, for example, the mixture after heating and melting obtained in Step 2 is laminated by being discharged or applied between the films having at least one release surface directly under the rolls, and at the same time, the film may be stretched and molded to a specific thickness by adjusting the gap between the rolls. Thus, a manufacturing method having a process in which Step 3 and Step 4 are substantially integrated is also included within the scope of the above manufacturing method.

In other words, Steps 3 and 4 may be carried out in a continuous and integrated manner, for example, a process in which the mixture obtained in Step 2 is discharged or applied between two release films to sandwich the aforementioned mixture between the two release films, such as between two long release films, and a process in which a laminated body comprising the two release films and the aforementioned mixture interposed therebetween is continuously passed between rolls to stretch and form the mixture between the release films to obtain a desired laminated body. Such a method in which Step 3 and Step 4 are performed in an integrated manner is also included in the above-described manufacturing method.

In addition, in the above Step 3 for Method A or Method B, the process of laminating the mixture after heating and melting between the films is not particularly limited, and may be a process in which (i) the mixture after heating and melting from Step 2 is discharged or applied onto the first release film having a release surface, and then the second release film is brought into contact with the surface of the mixture opposite to the surface in contact with the first release film, and the mixture after heating and melting is interposed, or in other words sandwiched, between the first and second release films, or (ii) by discharging or applying the mixture after heating and melting from Step 2 between the first release film and the second release film having a peeling surface, the mixture after heating and melting is sandwiched between the two release films. An example of (ii) is bringing the first and second release films into close proximity by suitable means, such as two rolls, and discharging or coating the mixture from Step 2 at the point where the two release films are brought into close proximity, thereby placing the mixture in the gap between the two release films at the same time or approximately at the same time. It is particularly preferred that the above Steps 3 and 4 are continuous processes.

The type of the film substrate is not particularly limited, and polyester film, polyolefin film, polycarbonate film, acrylic film, and the like can be used as appropriate. The sheet-like substrate is preferably non-porous.

The release layer is necessary for easily peeling off the sheet-like material consisting of the curable granular silicone composition from the film-like substrate, and is sometimes called a release liner, separator, release layer or release coating layer. Suitably, the release layer can be a silicone release agent, a fluorine release agent, an alkyd release agent, a release agent with a release coating function such as a fluorosilicone release agent and the like, or a substrate in and of itself that is difficult for the adhesive material layer to adhere to, made up of the curing reactive silicone adhesive composition of the present invention or the cured product thereof. In particular, in the laminated body of the present invention, a release layer obtained by curing a fluorosilicone based release agent is preferably used as the release layer.

The laminate described above can be used, for example, by peeling off the sheet-like member in an uncured state from the film-like substrate after applying the sheet-like member made up of the curable silicone composition to the adherend.

As the present composition can be handled in the form of pellets or sheets at room temperature, it is a non-flowable solid at 25° C. Here, the term "non-fluid" means that deforming or flowing does not occur in a no-load condition, and preferably does not deform or flow in a no-load condition at 25° C. when molded into a pellet, a tablet, or the like. Such non-fluid can be evaluated, for example, by placing a molded product of the composition on a hot plate at 25° C. where no substantial deforming or flowing under no load or a constant load should occur. This is because when non-fluid at 25° C., shape retention at this temperature is good, and the surface tackiness is low.

The softening point of the composition is preferably 100° C. or less. This manner of softening point means a temperature at which the deformation amount in the height direction is 1 mm or more when the deformation amount of the composition is measured after a load is removed while continuing to press the hot plate with a load of 100 grams for 10 seconds from above.

The present composition tends to decrease in viscosity rapidly under high temperature and high pressure (that is, in the molding step), and a value measured at a similar high temperature and high pressure is preferably used as a useful melt viscosity value. Therefore, the melt viscosity of the present invention is more preferably measured under high pressure using a Koka-type flow tester (manufactured by the Shimadzu Corporation) than when measured with a rotational viscometer such as a rheometer. Specifically, the present composition should have a melt viscosity at 150° C. of 200 Pa·s or less, and more preferably 150 or less. This is because after hot-melting and cooling to 25° C., the composition has good adhesion to the substrate.

Manufacturing Method of the Curable Silicone Composition

The composition can be manufactured by mixing powders of components (A) to (E), as well as any other components (preferably including component (F)), at a temperature of less than 50° C., or the like. The powder mixer used in this manufacturing method is not limited, and examples include a uniaxial or biaxial continuous mixer, a two-roll mixer, a ROSS mixer, a Hobart mixer, a dental mixer, a planetary mixer, a kneader mixer, a laboratory mill, a small-sized mill, and a Henschel mixer, and preferably, a laboratory mill and a Henschel mixer.

Method of Molding Cured Product

The composition can be cured by a method comprising at least the following steps (I) to (III).

(I) a step of heating to a temperature of 100° C. or higher to melt the present composition;
(II) a step of injecting the curable silicone composition obtained in step (I) into a mold or a step of distributing the curable silicone composition obtained in step (I) to a mold by clamping; and
(III) a step of curing the curable silicone composition injected in step (II).

In the above steps, a transfer molding machine, a compression molding machine, an injection molding machine, an auxiliary ram molding machine, a slide molding machine, a double ram molding machine, a low pressure sealing molding machine, or the like can be used. In particular, the composition of the present invention can be suitably used for the purpose of obtaining a cured product by transfer molding and compression molding.

Finally, in step (III), the curable silicone composition injected (applied) in step (II) is cured. In the case where (c1) organic peroxide is used as component (C), the heating temperature is preferably 150° C. or higher or 170° C. or higher, and in the case where (c2), organohydrogenpolysiloxane having at least two silicon-bonded hydrogen atoms in a molecule and a hydrosilylation reaction catalyst is used, the heating temperature is preferably 100° C. or higher or 130° C. or higher.

On the other hand, the curable silicone composition of the present invention can be molded into a thin film-like sheet having a thickness in the range of 100 to 1,000 μm by sandwiching it between sheet-like substrates provided with a release layer as described above and molding it to a predetermined thickness through two rolls or the like. The thin film-like sheet comprising said curable silicone composition can be used as a die attach film or a film-like curable silicone adhesive for manufacturing semiconductor chips and the like.

Use of Composition

Since the composition has hot-melt properties, excellent workability and curability while melted (hot-melt), and excellent coloration resistance of the resulting cured product under high temperature, it is usefully used for semiconductor components such as optical reflective materials for light emitting/optical devices and optical semiconductors with the cured product. Furthermore, since the cured product has superior mechanical properties, it is suitable as an encapsulant for semiconductors; an encapsulant for power semiconductors such as SiC, GaN, or the like; and an adhesive, potting agent, protective agent, and coating agent for electrical and electronic applications. Since the composition has hot-melt properties, it is also suitable as a material for transfer molding, compression molding, or injection molding. In particular, it is preferable to use the composition as an encapsulant for semiconductors using an overmold molding method at the time of molding. Furthermore, a sheet of this composition can be used as a curable film adhesive or as a buffer layer for stress between two substrates with different coefficients of linear expansion.

In addition, the curable silicone compositions of the present invention, especially the curable silicone compositions which are in pellet or sheet form, can be used for large-area encapsulation of semiconductor substrates (including wafers). Furthermore, a sheet formed from the curable granular silicone composition of the present invention can be used for die attach films, sealing flexible devices, stress relief layers for bonding two different substrates, and the like.

Use of Cured Product

The application of the cured product of the present invention is not particularly limited, but the composition of the present invention has hot-melt properties, is excellent in moldability and mechanical properties, and the cured product exhibits characteristic behavior of an average linear expansion coefficient and a storage modulus at room temperature to high temperature as described above. Therefore, the cured product obtained by curing the present composition can be suitably used as a member for a semiconductor device, and can be suitably used as a sealant for a semiconductor element, an IC chip or the like, and as an adhesive/bonding member of a conductor device.

A semiconductor device equipped with a member made of the cured product of the present invention is not particularly limited, but is particularly preferable to be a light emitting semiconductor device which is a light emitting/optical device. Since the cured product of the present invention has superior coloration resistance at high temperatures, it is more suitable for use as a light reflecting material used in optical semiconductor devices where whiteness is important.

EMBODIMENTS

The hot-melt curable silicone composition of the present invention and manufacturing method thereof are described in detail by means of examples and comparative examples. Note that in the formulas, Me and Vi represent a methyl group and a vinyl group, respectively. The softening points of the curable silicone compositions of each example and comparative example were measured by the following methods. The curable silicone composition was heated at 150° C. for 2 hours to produce a cured product, and the elastic modulus, tensile elongation modulus, and average linear expansion coefficient were measured by the following methods. The results are shown in Table 1.

Softening Point

The curable silicone composition was molded into cylindrical pellets of φ14 mm×22 mm. A pellet was placed on a hot plate set at 25° C. to 100° C. and continuously pressed from above for 10 seconds with a load of 100 grams, and after the load was removed, the amount of deformation of the pellet was measured. The temperature at which the deformation amount in the height direction was 1 mm or more was defined as the softening point.

Storage Elastic Modulus

The curable silicone composition was heated at 150° C. for 2 hours to prepare a cured product. The storage modulus of the cured product from −50° C. to 250° C. was measured using a rheometer ARES (manufactured by T.A. Instrument Japan Co., Ltd.), and the values at 25° C. were read. Table 1 shows the values measured at 25° C.

Average Linear Expansion Coefficient

The curable silicone composition was heated at 150° C. for 2 hours to prepare a cured product. Average linear expansion coefficient of the cured product in the temperature range of 25 to 200° C. was measured by the method specified in JIS K 7197-1991 "Testing Method for Linear Thermal Expansion Coefficient of Plastics by Thermomechanical Analysis."

Tensile Elongation

The curable silicone composition was heated at 150° C. for 2 hours to prepare a cured product. The tensile elongation rate of the cured product was measured using the method specified in JIS K 6251-2010 "Vulcanized Rubber and Thermoplastic Rubber-Determination of Tensile Properties."

Organopolysiloxane resins containing a hydrosilylation reaction catalyst were prepared by the methods shown in Reference Examples 1 to 4 below, and their hot melt properties were evaluated by the presence or absence of softening point/melt viscosity. Organopolysiloxane resin microparticles were also prepared by the methods shown in Reference Examples 3 and 4. In the reference examples, the 1,1,3,3-tetramethyl-1,3-divinyl disiloxane used for the platinum complex that is the hydrosilylation reaction catalyst is described as "1,3-divinyltetramethyldisiloxane".

Reference Example 1

270.5 g of an Organopolysiloxane 55 mass % xylene solution as well as 0.375 g of platinum 1,3-divinyltetramethyldisiloxane complex 1,3-divinyltetramethyldisiloxane solution (platinum metal content=approximately 4,000 ppm) represented by the average unit formula: $(Me_2ViSiO_{1/2})_{0.05}$ $(Me_3SiO_{1/2})_{0.39}(SiO_{4/2})_{0.56}(HO_{1/2})_{0.02}$ was introduced into a 1 L flask in white solid form at 25° C. and was uniformly stirred at room temperature (25° C.) to prepare an organopolysiloxane resin (1) xylene solution containing 10 ppm in terms of mass units as platinum metal.

In addition, the organopolysiloxane resin (1) did not soften/melt even when heated to 200° C. and did not have hot-melt properties.

Reference Example 2

270.5 g of an organopolysiloxane 55 mass % xylene solution as well as 0.375 g of platinum 1,3-divinyltetramethyldisiloxane complex 1,3-divinyltetramethyldisiloxane solution (platinum metal content=approximately 4,000 ppm) represented by the average unit formula: $(Me_3SiO_{1/2})_{0.44}(SiO_{4/2})_{0.56}(HO_{1/2})_{0.02}$ was introduced into a 1 L flask in white solid form at 25° C. and was uniformly stirred at room temperature (25° C.) to prepare an organopolysiloxane resin (2) xylene solution containing 10 ppm in terms of mass units as platinum metal.

In addition, the organopolysiloxane resin (2) did not soften/melt even when heated to 200° C. and did not have hot-melt properties.

Reference Example 3: Non-Hot Melt Organopolysiloxane Resin Particles (1)

A xylene solution of the organopolysiloxane resin (1) prepared in Reference Example 1 was converted into particles while removing the xylene by a spray method using a spray dryer at 50° C. Thus, spherical, non-hot melt organopolysiloxane resin particles (1) were prepared. Observation of the microparticles with an optical microscope revealed that the particle diameter was 5 to 10 μm and the average particle diameter was 6.9 μm.

Reference Example 4: Non-Hot Melt Organopolysiloxane Resin Particles (2)

A xylene solution of the organopolysiloxane resin (2) prepared in Reference Example 2 was converted into particles while removing the xylene by a spray method using a spray dryer at 50° C. Thus, spherical, non-hot melt organopolysiloxane resin particles (2) were prepared. Observation of the microparticles with an optical microscope revealed that the particle diameter was 5 to 10 μm and the average particle diameter was 7.4 μm.

Example 1

(a+c(pt)) 69.8 g of non-hot meltable organopolysiloxane resin microparticles (2) (vinyl group content=0 mass %), (b1) 29.9 g of dimethylpolysiloxane capped at both molecular terminals with dimethylvinylsiloxy groups represented by the formula: $ViMe_2SiO(Me_2SiO)_{800}Si-ViMe_2$ (vinyl group content=0.09 mass %), (c4(SiH) 0.2 g of organohydrogenpolysiloxane represented by the formula: $Me_3SiO(MeHSiO)_7(Me_2SiO)_{6.5}SiMe_3$
{an amount such that the silicon-bonded hydrogen atom in the organohydrogenpolysiloxane is 1.4 mol relative to 1 mol of vinyl groups in the dimethylpolysiloxane capped at both molecular terminals with dimethylvinylsiloxy groups}, (d1) 234.4 g of alumina (AES-12 from Sumitomo Chemicals) having an average particle diameter of 0.44 μm, and 1-ethynyl-1-cyclohexanol (an amount of 1,000 ppm in mass units relative to this composition), was batch fed into a small grinder and stirred for 1 minute at room temperature (25° C.) to prepare a uniform curable granular silicone composition. The present composition contained 0.10 mol % of vinyl groups in 100 g of silicone component. The measurement results of the softening point and other properties of this composition are shown in Table 1.

Example 2

(a+c(pt)) 66.0 g of non-hot meltable organopolysiloxane resin microparticles (2) (vinyl group content=0 mass %), (a+c(pt)) 3.5 g of non-hot meltable organopolysiloxane resin microparticles (1) (vinyl group content=1.91 mass %), (b1) 29.8 g of dimethylpolysiloxane capped at both molecular terminals with dimethylvinylsiloxy groups represented by the formula: $ViMe_2SiO(Me_2SiO)_{800}Si-ViMe_2$ (vinyl group content=0.09 mass %), (c4(SiH) 0.6 g of organohydrogenpolysiloxane represented by the formula: $Me_3SiO(MeHSiO)_7(Me_2SiO)_{6.5}SiMe_3$
{an amount such that the silicon-bonded hydrogen atom in the organohydrogenpolysiloxane resin is 1.3 mol relative to 1 mol of vinyl groups in the organopolysiloxane resin microparticle particles (1) and dimethylpolysiloxane capped at both molecular terminals with dimethylvinylsiloxy groups}, (d1) 218.4 g of alumina (AES-12 from Sumitomo Chemicals) having an average particle diameter of 0.44 μm, and 1-ethynyl-1-cyclohexanol (an amount of 1,000 ppm in mass units relative to this composition), was batch fed into a small grinder and stirred for 1 minute at room temperature (25° C.) to prepare a uniform curable granular silicone composition. The present composition contained 0.35 mol % of vinyl groups in 100 g of silicone component. The measurement results of the softening point and other properties of this composition are shown in Table 1.

Example 3

(a+c(pt)) 62.5 g of non-hot meltable organopolysiloxane resin microparticles (2) (vinyl group content=0 mass %), (a+c(pt)) 7.0 g of non-hot meltable organopolysiloxane resin microparticles (1) (vinyl group content=1.91 mass %), (b1) 29.8 g of dimethylpolysiloxane capped at both molecular terminals with dimethylvinylsiloxy groups represented by the formula: $ViMe_2SiO(Me_2SiO)_{800}Si-ViMe_2$ (vinyl group content=0.09 mass %), (c2(SiH)) 0.65 g of organohydrogenpolysiloxane resin represented by the formula: $(HMe_2SiO_{1/2})_{0.67}(SiO_{4/2})_{0.33}$ (silicon-bonded hydrogen atom content=0.95 mass %)
{amount such that the silicon-bonded hydrogen atom in the organohydrogenpolysiloxane resin is 1.0 mol relative to 1 mol of vinyl groups in the organopolysiloxane resin microparticle particles (1) and dimethylpolysiloxane capped at both molecular terminals with dimethylvinylsiloxy groups}, (d1) 273.0 g of alumina (AES-12 from Sumitomo Chemicals) having an average particle diameter of 0.44 μm, and 1-ethynyl-1-cyclohexanol (an amount of 1,000 ppm in mass units relative to this composition), was batch fed into a small grinder and stirred for 1 minute at room temperature (25° C.) to prepare a uniform curable granular silicone composition. The present composition contained 0.59 mol % of vinyl groups in 100 g of silicone component. The measurement results of the softening point and other properties of this composition are shown in Table 1.

Example 4

(a+c(pt)) 58.5 g of non-hot meltable organopolysiloxane resin microparticles (2) (vinyl group content=0 mass %),
(a+c(pt)) 10.3 g of non-hot meltable organopolysiloxane resin microparticles (1) (vinyl group content=1.91 mass %),
(b1) 29.5 g of dimethylpolysiloxane capped at both molecular terminals with dimethylvinylsiloxy groups represented by the formula: $ViMe_2SiO(Me_2SiO)_{800}Si-ViMe_2$ (vinyl group content=0.09 mass %),
(c4(SiH)) 1.57 g of organohydrogenpolysiloxane represented by the formula: $Me_3SiO(MeHSiO)_7(Me_2SiO)_{6.5}SiMe_3$
{an amount such that the silicon-bonded hydrogen atom in the organohydrogenpolysiloxane resin is 1.3 mol relative to 1 mol of vinyl groups in the organopolysiloxane resin microparticle particles (1) and dimethylpolysiloxane capped at both molecular terminals with dimethylvinylsiloxy groups},
(d1) 203.1 g of alumina (AES-12 from Sumitomo Chemicals) with an average particle diameter of 0.44 μm, and 1-ethynyl-1-cyclohexanol (an amount of 1,000 ppm in mass units relative to this composition), was batch fed into a small grinder and stirred for 1 minute at room temperature (25° C.) to prepare a uniform curable granular silicone composition. The present composition contained 0.83 mol % of vinyl groups in 100 g of silicone component. The measurement results of the softening point and other properties of this composition are shown in Table 1.

Example 5

(a+c(pt)) 55.3 g of non-hot meltable organopolysiloxane resin microparticles (2) (vinyl group content=0 mass %),
(a+c(pt)) 13.8 g of non-hot meltable organopolysiloxane resin microparticles (1) (vinyl group content=1.91 mass %),
(b1) 29.6 g of dimethylpolysiloxane capped at both molecular terminals with dimethylvinylsiloxy groups represented by the formula: $ViMe_2SiO(Me_2SiO)_{800}Si-ViMe_2$ (vinyl group content=0.09 mass %),
(c2(SiH)) 1.1 g of organohydrogenpolysiloxane resin represented by the formula: $(HMe_2SiO_{1/2})_{0.67}(SiO_{4/2})_{0.33}$ (silicon-bonded hydrogen atom content=0.95 mass %)
{amount such that the silicon-bonded hydrogen atom in the organohydrogenpolysiloxane resin is 1.1 mol relative to 1 mol of vinyl groups in the organopolysiloxane resin microparticle granules (1) and dimethylpolysiloxane capped at both molecular terminals with dimethylvinylsiloxy groups},
(d1) 232.6 g of alumina (AES-12 from Sumitomo Chemicals) having an average particle diameter of 0.44 μm, and
1-ethynyl-1-cyclohexanol (an amount of 1,000 ppm in mass units relative to this composition), was batch fed into a small grinder and stirred for 1 minute at room temperature (25° C.) to prepare a uniform curable granular silicone composition. The present composition contained 1.08 mol % of vinyl groups in 100 g of silicone component. The measurement results of the softening point and other properties of this composition are shown in Table 1.

Comparative Example 1

(a+c(pt)) 34.1 g of non-hot meltable organopolysiloxane resin microparticles (2) (vinyl group content=0 mass %),
(a+c(pt)) 34.1 g of non-hot meltable organopolysiloxane resin microparticles (1) (vinyl group content=1.91 mass %),
(b2) 14.5 g of dimethylpolysiloxane capped at both molecular terminals with dimethylvinylsiloxy groups represented by the formula: $ViMe_2SiO(Me_2SiO)_{140}Si-ViMe_2$ (vinyl group content=0.44 mass %),
(b3) 14.5 g of dimethylpolysiloxane capped at both molecular terminals with dimethylvinylsiloxy groups represented by the formula: $ViMe_2SiO(Me_2SiO)_{300}Si-ViMe_2$ (vinyl group content=0.21 mass %),
(c2(SiH)) 2.85 g of organohydrogenpolysiloxane resin represented by the formula: $(HMe_2SiO_{1/2})_{0.67}(SiO_{4/2})_{0.33}$ (silicon-bonded hydrogen atom content=0.95 mass %)
{amount such that the silicon-bonded hydrogen atom in the organohydrogenpolysiloxane resin is 1.1 mol relative to 1 mol of vinyl groups in the organopolysiloxane resin microparticle granules (1) and dimethylpolysiloxane capped at both molecular terminals with dimethylvinylsiloxy groups},
(d2) 142.6 g of titanium dioxide (SX-3103 manufactured by Sakai Chemical Industry Co., Ltd.) having an average particle diameter of 0.5 μm, (d3) 10.3 g of fumed silica (AEROSIL 50 from Japan Aerosil) having an average particle diameter of 0.04 μm, and 1-ethynyl-1-cyclohexanol (an amount of 1,000 ppm in mass units relative to this composition), was batch fed into a small grinder and stirred for 1 minute at room temperature (25° C.) to prepare a uniform curable granular silicone composition. The present composition contained 2.41 mol % of vinyl groups in 100 g of silicone component. The measurement results of the softening point and other properties of this composition are shown in Table 1.

Comparative Example 2

(a+c(pt)) 41.3 g of non-hot meltable organopolysiloxane resin microparticles (2) (vinyl group content=0 mass %),
(a+c(pt)) 27.5 g of non-hot meltable organopolysiloxane resin microparticles (1) (vinyl group content=1.91 mass %),
(b4) 27.5 g of dimethylpolysiloxane capped at both molecular terminals with dimethylvinylsiloxy groups represented by the formula: $ViMe_2SiO(Me_2SiO)_{45}Si-ViMe_2$ (vinyl group content=1.53 mass %),
(c2(SiH)) 3.68 g of organohydrogenpolysiloxane resin represented by the formula: $(HMe_2SiO_{1/2})_{0.67}(SiO_{4/2})_{0.33}$ (silicon-bonded hydrogen atom content=0.95 mass %)
{amount such that the silicon-bonded hydrogen atom in the organohydrogenpolysiloxane resin is 1.0 mol relative to 1 mol of vinyl groups in the organopolysiloxane resin microparticle particles (1) and dimethylpolysiloxane capped at both molecular terminals with dimethylvinylsiloxy groups}, (d2) 299.0 g of titanium dioxide (SX-3103 manufactured by Sakai Chemical Industry Co., Ltd.) having an average particle diameter of 0.5 μm, (d3) 1.5 g of fumed silica (AEROSIL 50 from Japan Aerosil) having an average particle diameter of 0.04 μm, and 1-ethynyl-1-cyclohexanol (an amount of 1,000 ppm in mass units relative to this composition), was batch fed into a small grinder and stirred for 1 minute at room temperature (25° C.) to prepare a uniform curable granular silicone composition. The present composition contained 3.51 mol % of vinyl groups in 100 g of silicone component. The measurement results of the softening point and other properties of this composition are shown in Table 1.

Comparative Example 3

(a+c(pt)) 32.5 g of non-hot meltable organopolysiloxane resin microparticles (2) (vinyl group content=0 mass %),
(a+c(pt)) 32.5 g of non-hot meltable organopolysiloxane resin microparticles (1) (vinyl group content=1.91 mass %),
(b2) 28.0 g of dimethylpolysiloxane capped at both molecular terminals with dimethylvinylsiloxy groups represented by the formula: ViMe$_2$SiO(Me$_2$SiO)$_{800}$SiViMe$_2$ (vinyl group content=0.44 mass %),
(c4(SiH) 5.0 g of organohydrogenpolysiloxane represented by the formula: HMe$_2$SiO(Me$_2$SiO)$_{17}$SiMe$_2$H
(c4(SiH) 2.6 g of organohydrogenpolysiloxane represented by the formula: Me$_3$SiO(MeHSiO)$_7$(Me$_2$SiO)$_{6.5}$SiMe$_3$
{an amount such that the silicon-bonded hydrogen atom in the organohydrogenpolysiloxane resin is 1.0 mol relative to 1 mol of vinyl groups in the organopolysiloxane resin microparticle particles (1) and dimethylpolysiloxane capped at both molecular terminals with dimethylvinylsiloxy groups},
1-ethynyl-1-cyclohexanol (an amount of 1,000 ppm in mass units relative to this composition), was batch fed into a small grinder and stirred for 1 minute at room temperature (25° C.) to prepare a uniform curable granular silicone composition. The present composition contained 2.39 mol % of vinyl groups in 100 g of silicone component. The measurement results of the softening point and other properties of this composition are shown in Table 1.

TABLE 1

|  | Examples | | | | | Comparative Examples | | |
| --- | --- | --- | --- | --- | --- | --- | --- | --- |
|  | 1 | 2 | 3 | 4 | 5 | 1 | 2 | 3 |
| Softening Point | 80 | 80 | 80 | 80 | 80 | 90 | 100 | 65 |
| Storage elastic modulus @ 25° C. [MPa] | 150 | 145 | 130 | 120 | 145 | 90 | 520 | 30 |
| Tensile elongation [%] | 240 | 170 | 210 | 160 | 150 | 35 | 29 | 290 |
| Average coefficient of linear expansion [ppm/K] | 122 | 126 | 110 | 124 | 120 | 134 | 105 | 280 |

The curable silicone compositions of Examples 1 to 5 are hot-melt compositions having a softening point at 80° C. Both the storage modulus and the tensile elongation modulus of the cured product are high, and the average coefficient of linear expansion is suppressed. In other words, the curable compositions of Examples 1 to 5 provide cured products with moderate flexibility and superior toughness and stress relief properties.

On the other hand, in Comparative Examples 1 to 3, the content of the vinyl (CH2=CH—) group portion of the cured reactive functional group containing a carbon-carbon double bond per 100 g of silicone component in the composition of the present invention exceeds the upper limit of the amount required for the present invention. In Comparative Examples 1 and 2, the tensile elongation rate is very low, and in Comparative Example 3, the average coefficient of linear expansion is excessive, and these curable silicone compositions have insufficient flexibility and elongation or stress relief properties as molding materials.

Manufacturing Example 1

The granulated curable silicone composition, such as Example 1 above, was heated to 80° C., heated and melted using a twin-screw extruder, kneaded in the form of a semi-solid softened material, and then fed onto a release film (FL2-01 manufactured by Takara Inc.) at a feed rate of 5 kg/hour and laminated between the two release films. The laminate body was then stretched between rolls to form a laminate body in which a hot-melt curable silicone sheet having a thickness of 500 μm is laminated between two peelable films, and the entire laminate body was cooled by a cooling roll set at −15° C. In said laminate body, a flat and homogeneous hot-meltable curable silicone sheet was obtained by separating the release film.

Manufacturing Example 2

The granulated curable silicone compositions of Example 1 and the like described above were heated to 80° C., melted and kneaded using a twin-screw extruder, formed into a sheet shape using a T-type die (opening dimensions: 800 μm×100 mm, heated to 80° C.), and then fed onto a release film (FL2-01 manufactured by Takara Inc.) at a feed rate of 5 kg/hour. The entire sheet was cooled by a cooling roll set at −15° C., and then laminated between the two release films. The laminate body was then stretched between rolls to form a laminate body in which a hot-melt curable silicone sheet having a thickness of 500 μm is laminated between two peelable films. In said laminate body, a flat and homogeneous hot-meltable curable silicone sheet was obtained by separating the release film.

The invention claimed is:

1. A curable granular silicone composition that has hot-melt properties as a whole, comprising:
   (A) 100 mass parts of an organopolysiloxane resin A particulate having no hot-melt properties as a whole molecule, having at least one curing reactive functional group containing a carbon-carbon double bond, and where 20 mol % or more of the total siloxane units of the organopolysiloxane resin A particulate is siloxane units represented by SiO$_{4/2}$;
   (B) 350 to 600 mass parts of an organopolysiloxane resin B particulate having no hot-melt properties as a whole molecule, not having a curing reactive functional group containing a carbon-carbon double bond, and where 20 mol % or more of the total siloxane units of the organopolysiloxane resin B particulate is siloxane units represented by SiO$_{4/2}$;
   (C) 65 to 200 mass parts of a straight- or branched-chain organopolysiloxane, liquid at 25° C., having at least two curing reactive functional groups containing a carbon-carbon double bond;
   (D) one or more curing agents selected from (d1) or (d2) below, in an amount necessary to cure the composition:

(d1) an organic peroxide,
(d2) an organohydrogenpolysiloxane having at least two silicon-bonded hydrogen atoms and a hydrosilylation reaction catalyst; and
(E) a functional filler, where the amount of component (E) is in the range of 10 to 1,000 mass parts relative to 100 mass parts of the sum of the components (A) to (C);
wherein a vinyl ($CH_2$=CH—) group content of curing reactive functional groups containing carbon-carbon double bonds is 0.05 to 1.50 mol % per 100 g of silicone component(s) in the composition; and
wherein component (A) and component (B) are spherical organopolysiloxane resin microparticles having an average primary particle diameter of 1 to 20 μm.

2. The curable granular silicone composition according to claim 1,
where the amount of component (E) is in the range of 10 to 750 mass parts relative to 100 mass parts of the sum of the components (A) to (C).

3. The curable granular silicone composition according to claim 1, wherein:
component (A) is a non-hot-meltable organopolysiloxane resin represented by the following average unit formula (A1):

$(R^1{}_3SiO_{1/2})_a(R^1{}_2SiO_{2/2})_b(R^1SiO_{3/2})_c(SiO_{4/2})_d(R^2O_{1/2})_e$ where each $R^1$ is independently a monovalent hydrocarbon group having 1 to 10 carbon atoms, provided that 1 to 12 mol % of all $R^1$ in formula (A1) is an alkenyl group; each $R^2$ is a hydrogen atom or an alkyl group having 1 to 10 carbon atoms; and a, b, c, d, and e are numbers satisfying the following: 0.10≤a≤0.60, 0≤b≤0.70, 0≤c≤0.80, 0.20≤d≤0.65, 0≤e≤0.05, and (a+b+c+d)=1;
component (B) is a non-hot-meltable organopolysiloxane resin represented by the following average unit formula (B1):

$(R^3{}_3SiO_{1/2})_f(R^3{}_2SiO_{2/2})_g(R^3SiO_{3/2})_h(SiO_{4/2})_i(R^2O_{1/2})_j$ where each $R^3$ is independently a monovalent hydrocarbon group having 1 to 10 carbon atoms and not containing a carbon-carbon double bond; $R^2$ is a hydrogen atom or an alkyl group having 1 to 10 carbon atoms; and f, g, h, i, and j are numbers satisfying the following: 0.35≤f≤0.55, 0≤g≤0.20, 0≤h≤0.20, 0.45≤i≤0.65, 0≤j≤0.05, and(f+g+h+i)=1;
component (C) is a straight-chain organopolysiloxane represented by the following structural formula (C1):

$R^4{}_3SiO(SiR^4{}_2O)_kSiR^4{}_3$ where each $R^4$ is independently a monovalent hydrocarbon group having 1 to 10 carbon atoms, provided that at least two of the $R^4$ in formula (C1) are alkenyl groups, and k is a number from 20 to 5,000; and
component (E) is one or more types selected from the group consisting of a reinforcing filler, a white pigment, a thermally conductive filler, an electrically conductive filler, and an organic filler.

4. The curable granular silicone composition according to claim 1, wherein component (D) comprises:
(d2-1) the organohydrogenpolysiloxane having at least two silicon-bonded hydrogen atoms and (d2-2) the hydrosilylation reaction catalyst, where
the content of the (d2-1) organohydrogenpolysiloxane is an amount where the molar ratio of the silicon-bonded hydrogen atoms in the organohydrogenpolysiloxane relative to the curing reactive functional groups containing the carbon-carbon double bonds in component (A) and component (C) is in the range of 0.5 to 20.

5. The curable granular silicone composition according to claim 1, wherein component (E) is a functional filler containing one or more types selected from the group consisting of a reinforcing filler, a white pigment, a thermally conductive filler, an electrically conductive filler, and an organic filler.

6. The curable granular silicone composition according to claim 1, further comprising:
(F) hot-melt particles with a drip point of 50° C. or more and a melt viscosity of 10 Pa·s or less as measured by a rotational viscometer at 150° C.

7. The curable granular silicone composition according to claim 6, wherein component (F) is a hot-melt particle comprising a fatty acid metal salt.

8. A method for manufacturing the curable granular silicone composition according to claim 1, wherein each component that makes up the curable granular silicone composition is granulated by mixing under temperature conditions not exceeding 50° C.

9. A method of molding a cured product, comprising the following steps:
(I) heating and melting the curable granular silicone composition according to claim 1 at a temperature of 50° C. or higher to form a curable silicone composition;
(II) injecting the curable silicone composition in a liquid state obtained in step (I) into a mold or distributing the curable silicone composition obtained in step (I) to a mold by clamping; and
(III) curing the curable silicone composition injected or distributed in step (II).

10. The curable granular silicone composition according to claim 1, wherein component (D) comprises component (d2).

* * * * *